United States Patent
Ohhashi et al.

(10) Patent No.: US 6,400,234 B1
(45) Date of Patent: Jun. 4, 2002

(54) STRIP LINE FEEDING APPARATUS

(75) Inventors: Hideyuki Ohhashi; Yukihiro Tahara; Moriyasu Miyazaki, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/500,995

(22) Filed: Feb. 9, 2000

(30) Foreign Application Priority Data

Aug. 3, 1999 (JP) .......................................... 11-219900

(51) Int. Cl.[7] ................................................. H01P 5/02
(52) U.S. Cl. ......................................... 333/33; 333/260
(58) Field of Search .................................... 333/33, 260

(56) References Cited

U.S. PATENT DOCUMENTS

| | | | |
|---|---|---|---|
| 2,422,160 A | * 6/1947 | Woodward, Jr. | .......... 333/33 X |
| 2,938,175 A | 5/1960 | Sommers et al. | |
| 4,494,083 A | * 1/1985 | Josefsson et al. | ............. 333/33 |
| 4,816,791 A | * 3/1989 | Carnahan et al. | ............. 333/33 |
| 5,093,640 A | * 3/1992 | Bischof | ........................ 333/33 |
| 5,994,983 A | * 11/1999 | Andersson | .............. 333/260 X |

FOREIGN PATENT DOCUMENTS

| | | |
|---|---|---|
| DE | 1 541 670 | 9/1969 |
| JP | 1-309401 | 12/1989 |
| JP | 5-259713 | 10/1993 |
| JP | A8250912 | 9/1996 |

OTHER PUBLICATIONS

Liao, Microwave Devices and Circuits, 1980, Prentice–Hall Inc., Englewood Cliffs, NJ, pp. 419.*
Foreign Search Report FA 587847 FR 0002270 Jan. 31, 2002.

* cited by examiner

Primary Examiner—Justin P. Bettendorf

(57) ABSTRACT

A reflection characteristic in a high frequency region at a feeding point into a strip line is improved and the assembly of a strip line feeding apparatus facilitated by the method and apparatus herein. The strip line includes a strip line pattern on a surface of a first dielectric substrate having a ground conductor pattern disposed on the opposite surface thereof, and a second ground conductor pattern disposed on a surface of a second dielectric substrate. A serial high impedance portion is disposed at an area near the tip portion of the strip line pattern. The high impedance portion includes a portion of the strip line pattern having narrowed width or a hole disposed under a through-hole for an inner conductor, which electrically connects the strip line pattern and an inner conductor. Dimensions of the high impedance portion are controlled to cancel out parasitic susceptance due to the discontinuous structure. A matching through-hole is further disposed in the second dielectric substrate in an area separated from the tip portion of the strip line pattern by a distance of around 25% of the typical wave length. The matching through-hole is elongated to a land pattern in a hole disposed in the second ground conductor pattern so as to electrically connect the conductor strip pattern and the land pattern.

18 Claims, 17 Drawing Sheets

STRIP LINE FEEDING APPARATUS

BACKGROUND OF THE INVENTION

1. Field of the invention

The present invention relates to a strip line feeding apparatus for feeding a high frequency signal to a strip line.

2. Description of the prior art

FIG. 33 is a plan view of an example of the strip line feeding apparatus in the prior art, which was disclosed in Japanese Patent Application JP-A-8-250912. In the figure, reference numerals 1, 2, 3, 4, 10, 40 denote, respectively, a strip conductor pattern, an arc like conductor pattern, a through-hole for inner conductor, a tip portion of the strip conductor pattern 1, and a through-hole for a fixing bolt.

FIG. 34 and FIG. 35 are cross sectional views of FIG. 33, along the lines a—a' and b—b', respectively. In these figures, reference numerals 5a, 5b denote first and second dielectric substrates, and the reference numerals 6a, 6b denote first and second ground conductor patterns, respectively. Reference numeral 20 denotes a coaxial connector.

The strip conductor pattern 1 is formed on one side of the first dielectric substrate 5a, and the first ground conductor pattern 6a is formed on the other side of the first dielectric substrate. The second ground conductor pattern 6b is formed on one side of the second dielectric substrate 5b. The first and the second dielectric substrates 5a, 5b are disposed one over another to form a strip line. The cross sections of the strip line are shown in FIGS. 34, 35. The first and second ground conductor patterns 6a, 6b are disposed at the outer sides of the strip line, respectively.

Reference numerals 20, 7, 8, 9 denote, respectively, a coaxial connector, a central conductor of the coaxial connector, a dielectric portion of the coaxial connector, and an outer conductor of the coaxial connector.

The through-hole for inner conductor 3 is disposed at the tip portion of the strip line pattern 10, and the arc like conductor patterns 2 are formed on the first and second dielectric substrates at the side opposite to the side where the first and second ground conductor patterns are formed, so that the arc like conductor pattern 2 surrounds the through-hole for inner conductor 3.

A plurality of the through-holes for outer conductor 4 are disposed along the inner border of the arc like conductor pattern 2. The through-holes for outer conductor 4 penetrate the arc like conductor pattern 2 and connect the first and second ground patterns 6a, 6b, which are disposed at the upper and lower surfaces of the dielectric substrates. The plurality of the through-holes for outer conductor 4 form a cage having a substantially cylindrical form. The through-hole for inner conductor 3 and the through-holes for outer conductor 4 form a coaxial line structure, the characteristic impedance of which is substantially equal to that of the coaxial connector 20 and that of the strip line.

The central conductor 7 of the coaxial connector 20 is inserted into the through-hole for inner conductor 3 from the side of the first ground conductor pattern 6a of the dielectric substrate 5a. And the central conductor 7 is soldered to be fixed to the through-hole 3 so as to electrically contact thereto.

The outer conductor 9 of the coaxial connector 20 electrically contacts to the first ground conductor pattern 6a of the dielectric substrate. By the way, the central conductor 7 is supported by the dielectric portion 8 of the coaxial connector so as to be held in the inner space of the outer conductor 9 of the coaxial connector.

The through-hole 40 for a fixing bolt has dimensions identical to that of the threaded holes disposed in the flange of the coaxial connector 20 so that the flange of the coaxial connector 20 can be fixed to the first and second dielectric substrates 5a, 5b, by means of fixing bolts, which can penetrate the holes.

A high frequency signal is supplied from the coaxial connector 20 to the strip conductor pattern 1, through the through-hole for inner conductor 3. The provided signal propagates along the strip line.

The ground signal flows from the outer conductor 9 of the coaxial connector 20 into the first ground conductor 6a on the upper surface of the dielectric substrate 5a. A part of the ground signal flows in the first ground conductor 6a, which is disposed along the strip line conductor pattern 1. And the rest flows into the second ground conductor 6b through the through-hole for outer conductor 4, and flows in the second ground conductor 6b, which is disposed along the strip line pattern 1.

The coaxial line structure formed by the through-hole for inner conductor 3 and the through-holes for outer conductor 4 has dimensions substantially identical to that of the coaxial connector so that high frequency signals propagated in the coaxial line can be fed effectively to the strip line.

The strip line feeding apparatus in the prior art has drawbacks that the electromagnetic field is disturbed and the electromagnetic wave reflection characteristic is deteriorated. That is because there are discontinuous structures at the junction portion between the central conductor of the coaxial connector 20 and the through-hole for inner conductor 3, as well as at the junction portion between the through-hole 3 and the strip conductor pattern 1.

Furthermore, the junction portion between the coaxial connector 20 and the through-hole for inner conductor 3 is arranged in the inside of layered substrates, as a result, the fixing process such as soldering at the junction is difficult in the prior art. Especially when the structure in the prior art is applied in multi-layered substrates, it is necessary to dispose hidden blind through-holes. This entails to a complicated fabrication process.

SUMMARY OF THE INVENTION

An object of the present invention is to eliminate the above-mentioned drawbacks.

Another object is to propose a strip line feeding apparatus, which has a good reflection characteristic in the high frequency region.

Another object is to propose a strip line feeding apparatus, which can be easily fabricated.

The objects are attained by the strip line feeding apparatus described in the independent claims.

In an embodiment of the present invention, the strip line feeding apparatus comprises:

a first dielectric substrate, on one surface of which a strip conductor pattern is disposed, and on the other surface of which a first ground conductor pattern is disposed;

a second dielectric substrate, on one surface of which a second ground conductor pattern is disposed, the first and the second substrates are disposed one over the other so as to form a strip line so that the first and second ground conductor patterns are disposed at the outsides of the strip line;

a through-hole for inner conductor, which is connected with the tip portion of the strip conductor pattern and is penetrating the first dielectric substrate;

through-holes for outer conductor, which are disposed around the through-hole for inner conductor and are connecting the first and second ground conductor patterns disposed on the upper and under surfaces of the strip line;

and a signal feeder comprised of a signal conductor and a ground conductor, the signal conductor is electrically connected with the strip conductor pattern through the through-hole for inner conductor, and the ground conductor is electrically connected with the first and second ground pattern through the through-holes for outer conductor;

wherein a serial high impedance portion is disposed near to the connecting portion between the strip conductor pattern and the through-hole for inner conductor.

In an embodiment of the present invention, the high impedance portion is a portion disposed near to the tip portion of the strip conductor pattern, where the width of the strip conductor pattern is narrowed.

In an embodiment of the present invention, the high impedance portion is a hole disposed in the area of the second ground conductor of the second dielectric substrate just under the through-hole for inner conductor.

In an embodiment of the present invention, the strip line feeding apparatus comprises:

a first dielectric substrate, on one surface of which a strip conductor pattern is disposed, and on the other surface of which a first ground conductor pattern is disposed;

a second dielectric substrate, on one surface of which a second ground conductor pattern is disposed, the first and the second substrates are disposed one over another so as to form a strip line so that the first and second ground conductor patterns are disposed at the outside of the strip line;

a through-hole for inner conductor, which is connected with the tip portion of the strip conductor pattern and is penetrating the first dielectric substrate;

through-holes for outer conductor, which are disposed around the through-hole for inner conductor and are connecting the first and second ground conductor pattern disposed on the upper and under surfaces of the strip line;

and a signal feeder comprised of a signal conductor and a ground conductor, the signal conductor is electrically connected with the strip conductor pattern through the through-hole for inner conductor, and the ground conductor is electrically connected with the first and second ground pattern through the through-holes for outer conductor;

wherein a matching through-hole, connected with the strip conductor pattern at a point distant from the through-hole for inner conductor by about a quarter of the using wave length, is disposed in the second dielectric substrate, and penetrates the second dielectric substrate, and short circuiting through-holes, which penetrate the first and second dielectric substrates and electrically connect with the first and second ground conductors, are disposed around the matching through-hole.

In an embodiment of the present invention, a land pattern, electrically connected with the matching through-hole, is disposed on the under surface of the second dielectric substrate in the area of the second ground conductor under the matching through-hole, the land pattern is disconnected from the second ground conductor.

In an embodiment of the present invention, the through-hole for inner conductor elongates to penetrate the second dielectric substrate.

In an embodiment of the present invention, a land pattern electrically connected with the through-hole for inner conductor, is disposed in the area of the second ground conductor on the under surface of the second dielectric substrate, the land pattern is disconnected from the second ground conductor.

In an embodiment of the present invention, the through-holes for outer conductor are disposed around the through-hole for inner conductor so as to form a cylindrical cage.

In an embodiment of the present invention, the signal feeder is a coaxial connector, the central conductor of which is inserted into the through-hole for inner conductor from the strip conductor pattern side and is electrically connected with the through-hole for inner conductor, and the outer conductor of the coaxial connector is electrically connected to the first ground conductor pattern through the through-holes for outer conductor.

In an embodiment of the present invention, the signal feeder is a micro strip line, which comprises: a third dielectric substrate disposed on the first dielectric substrate at the opposite side of the second dielectric substrate; a second strip conductor pattern disposed on a surface of the third dielectric substrate at the opposite side of the first ground conductor pattern, the tip portion of the strip conductor pattern and the tip portion of the second strip conductor pattern are arranged so that one is over the other. The through-hole for inner conductor elongates to penetrate the third dielectric substrate so that tip portion of the second strip conductor pattern is electrically connected with that of the strip conductor pattern.

In an embodiment of the present invention, further comprises:

a fourth dielectric substrate, which is disposed under the second dielectric substrate;

and a third ground conductor pattern is disposed on a surface of the fourth dielectric substrate at the opposite side of the second dielectric substrate.

The third ground conductor pattern is electrically connected with the first and second ground patterns.

DETAILED DESCRIPTION OF THE PREFERRED EMBODIMENT

Embodiment 1

Figure 1:
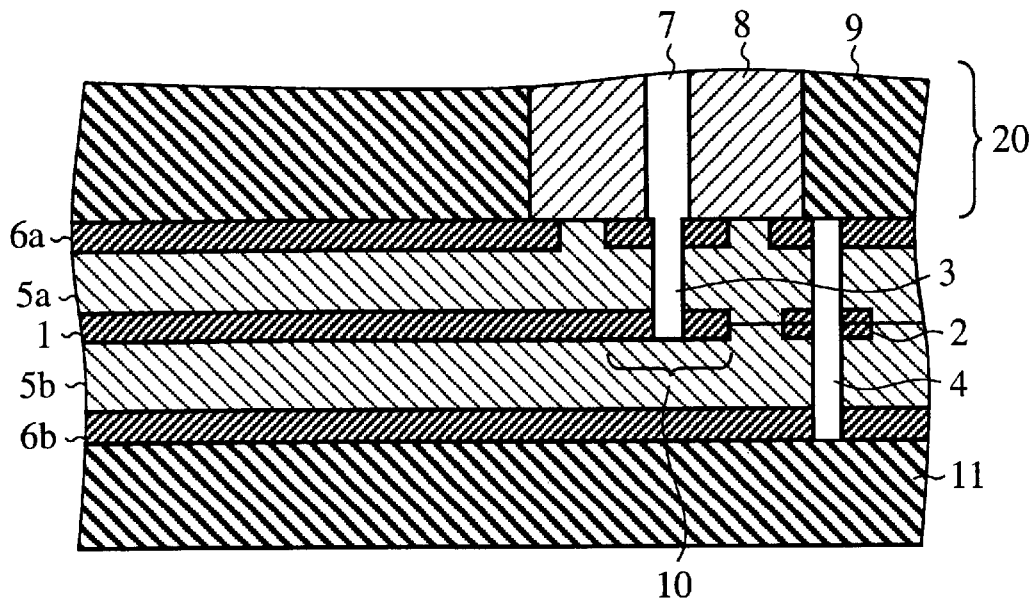
FIG. 1 is a cross sectional view of the strip conductor feeding apparatus according to the first embodiment of the present invention.

A strip line feeding apparatus according to the first embodiment of the present invention is explained below, referring to FIGS. 1–4.

The strip line feeding apparatus comprises a first and second dielectric substrates 5a, 5b and a coaxial connector 20. The strip line feeding apparatus is mounted on a chassis 11.

In these figures, reference numerals 1, 2, 3, 4, 5a, 5b, 6a, 6b, 10,and 30 denote, respectively, a strip conductor pattern, an arc like conductor, a through-hole for inner conductor, through-holes for outer conductor, first dielectric substrate, a second dielectric substrate, a first ground conductor pattern, a second ground conductor pattern, a tip portion of the strip conductor pattern, and a high impedance portion. And reference numerals 20, 7, 8, and 9 denote a coaxial connector, the central conductor of the coaxial connector, the dielectric portion, and the outer conductor of the coaxial connector. Reference numeral 11 denotes a chassis.

A strip conductor pattern 1 is formed on one side of the first dielectric substrate 5a, and a first ground conductor pattern 6a is formed on the other side of the first dielectric substrate 5a. A second ground conductor pattern 6b is formed on one side of the second dielectric substrate 5b.

Figure 3:
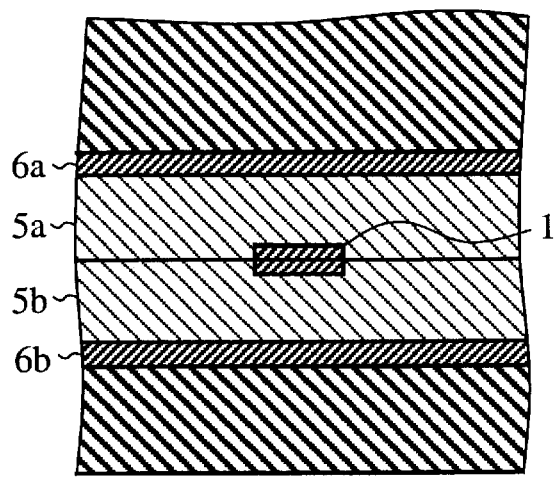
FIG. 3 is a cross sectional view of the strip line feeding apparatus of the first embodiment, along the line a—a' in FIG. 2.

The first and the second dielectric substrates 5a, 5b are disposed one over the other to form a layered strip line, as shown in FIGS. 3, so that the first and second ground conductor patterns 6a, 6b are disposed at the outer sides of the strip line, respectively.

A through-hole for inner conductor 3 is disposed in a tip portion 10 of the strip conductor pattern 1. An arc like conductor pattern 2 is formed on the first dielectric substrate 5a on the side opposite to the side where the ground conductor 6a is disposed, so that the through-hole for inner conductor 3 is surrounded by the arc like conductor pattern 2.

A plurality of the through-holes for outer conductor 4 are disposed in the arc like conductor 2. The through-holes for outer conductor 4 penetrate the arc like conductor pattern 2 so that the first and second ground conductor patterns 6a, 6b, which are found at the upper surface and the lower surface of the strip line, are electrically connected to the arc like conductor pattern 2.

The plurality of the through-holes for outer conductor 4 form a cage having a substantially cylindrical form, and the through-hole for inner conductor 3 and the through-holes for outer conductor 4 form a quasi coaxial line.

The central conductor 7 of the coaxial connector 20 is inserted into the through-hole for inner conductor 3 from the side of the first ground conductor pattern 6a of the first dielectric substrate 5a, and is fixed to the through-hole for inner conductor, for example, by soldering. Thus an electrical connection between them is assured.

In general, the through-holes in the strip line feeding apparatus according to the present invention are electrically conductive, because inside of them is soldered or filled with a conductive material until the end of the fabrication process.

The outer conductor 9 of the coaxial connector 20 contacts with the first ground conductor 6a of the first dielectric substrate 5a so that they are electrically connected to each other. The central conductor 7 is supported by the dielectric portion 8 so as to be held in the space in the outer conductor 9 of the coaxial connector 20.

The strip line, the coaxial connector and the quasi coaxial line which is formed by the through-holes, have a substantially identical characteristic impedance.

A high impedance portion 30 is disposed at a position near to the tip portion 10 of the strip conductor pattern 1. The width of the high impedance portion 30 is narrower than that of the other part of the strip conductor pattern 1 so that the characteristic impedance of the portion 30 is higher than that of the other part of the strip conductor pattern 1.

The flow direction of the high frequency current turns by 90 degrees at the connecting portion, where the central portion 7 of the coaxial connector 20 is connected to the strip conductor pattern 1 through the through-hole for inner conductor 3. That is to say, the flow direction of the electric current is discontinuous. In such a structure, the electromagnetic field is strongly disturbed so that the reflection characteristic of the electromagnetic wave deteriorates. The disturbance of the electromagnetic field causes a parasite susceptance.

The susceptance is parallel capacitive, in the same manner as at a 90 degree turning point in a two dimensional micro-strip line. The high impedance portion 30, which has a characteristic impedance higher than the neighboring portion and is disposed at a point near to the discontinuous portion, acts equivalently as a serial inductive element. Therefore, the parasite parallel capacitive susceptance at the discontinuous portion can be cancelled out by the equivalent serial inductive element, by designing the dimensions of the high impedance portion 30 to be appropriate values. As a result, the reflection characteristic of the strip line can be improved.

Figure 4:
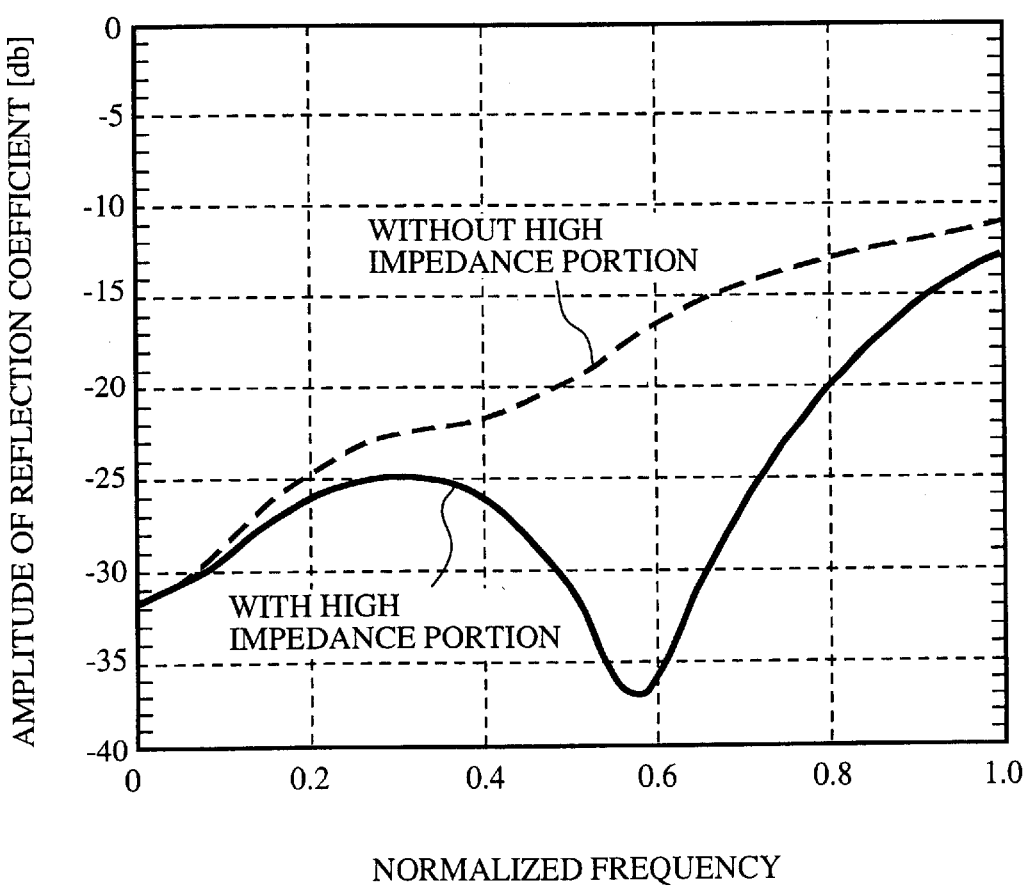
FIG. 4 is a graph showing logical characteristics of the strip line feeding apparatus of the first embodiment, in which reflectivity is calculated for cases that no high impedance portion is disposed, and a high impedance portion is disposed, respectively.

FIG. 4 is a logical characteristic for estimating the effect of the high impedance portion 30. The characteristic is obtained by a FD-TD simulation method (Finite-Difference Time-Domain method), which is a method for a simulation of the three dimensional electromagnetic field analysis. Reflection characteristics are calculated for cases that the high impedance portion 30 is disposed and is not disposed. FIG. 4 shows that the reflection characteristic is improved by the high impedance portion 30.

As explained above, according to the first embodiment of the present invention, a high impedance portion 30 is disposed near to the discontinuous structure portion where the flow direction of the high frequency current turns by 90 degrees. As a result, an advantage is obtained in that the deterioration of the reflection characteristic of the strip line feeding apparatus in a high frequency region can be made small.

Embodiment 2

Figure 6:
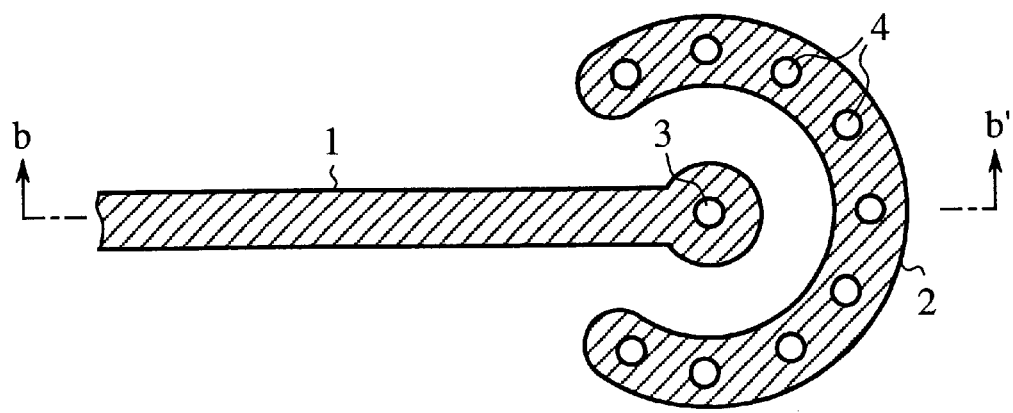
FIG. 6 is a plan view of an example of the conductor pattern, such as a strip conductor pattern, disposed at the under surface of the first dielectric substrate, of the strip line feeding apparatus of the second embodiment.
Figure 7:
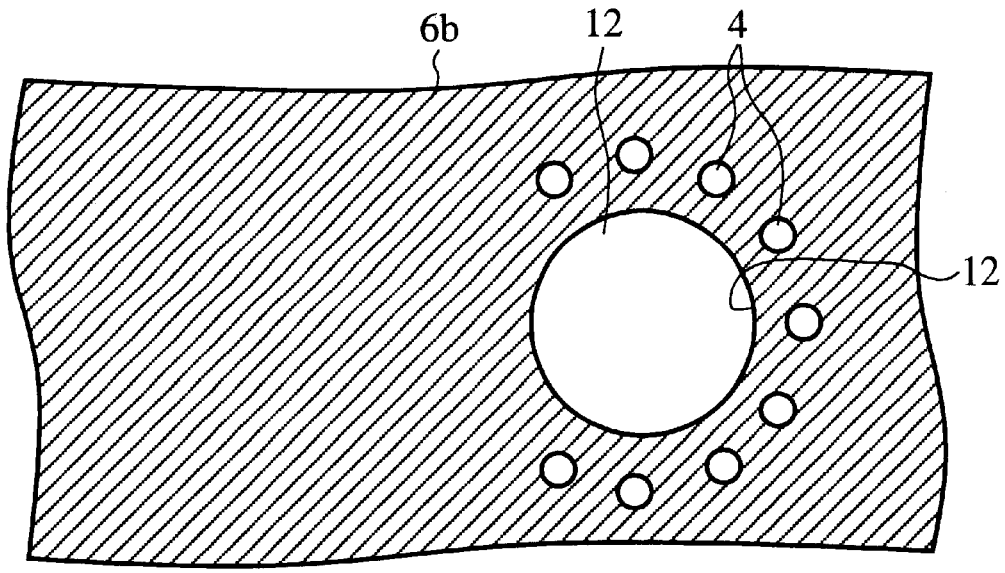
FIG. 7 is a plan view of the conductor patterns such as the ground conductor patterns disposed on the under surface of the second dielectric substrate in the strip line feeding apparatus according to the second embodiment of the present invention.

A strip line feeding apparatus according to the second embodiment of the present invention is explained below, referring to FIGS. 5–7.

Figure 2:
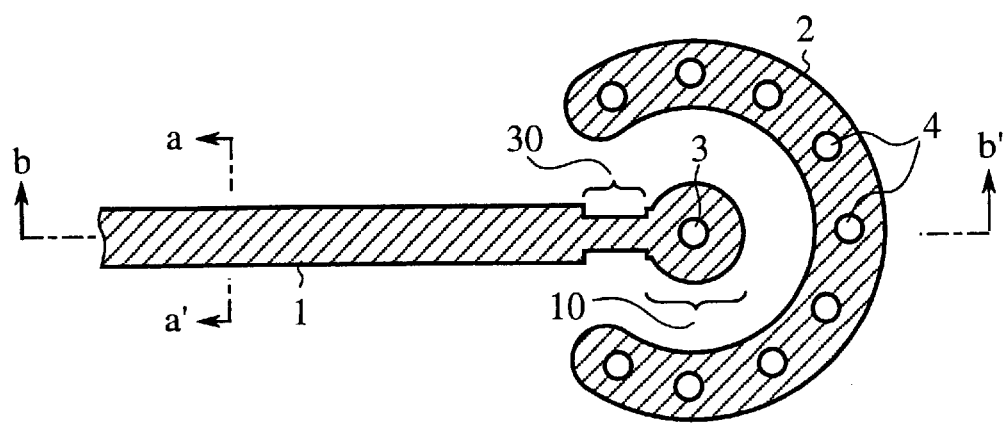
FIG. 2 is a plan view of an example of the conductor pattern of the strip line feeding apparatus of the first embodiment, disposed at the under surface of the first dielectric substrate.
Figure 5:
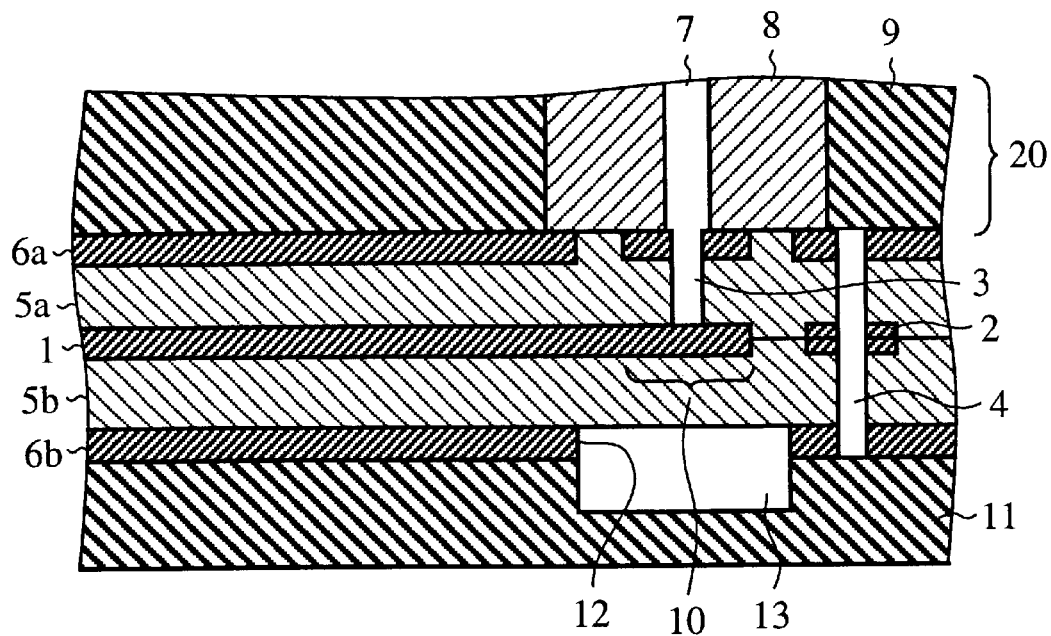
FIG. 5 is a cross sectional view of the strip line feeding apparatus according to the second embodiment of the present invention.

FIG. 5 is a cross sectional view of a strip line feeding apparatus according to the second embodiment. FIG. 6 is a plan view of the conductor patterns on the under surface of the first dielectric substrate 5a in FIG. 5. FIG. 5 shows the cross sectional structure of FIG. 6, along the line b—b'. FIG. 7 is a front view of the conductor patterns on the under surface of the second dielectric substrate 5b. Components in these figures identical to or equivalent to those in FIGS. 1–3 are referred to the same reference numerals. And their explanations are omitted.

Reference numerals 12, 13 denote, respectively, a circular hole disposed in the second ground conductor pattern 6b at a position just below the tip portion 10 of the strip conductor pattern 10, and a cylindrical recess 13 disposed in the chassis 11 in the position further below the hole 12.

Because a hole 12 is disposed in the second ground pattern 6b, at the region where the central conductor 7 of the coaxial connector 20 is connected to the strip conductor pattern 1 through the through-hole for inner conductor 3, the equivalent characteristic impedance of the strip line in this region increases. Therefore, the parasite susceptance due to the discontinuity of the structure at the connecting portion can be compensated by this equivalent high impedance, when the dimensions of the hole 12 is designed appropriately. Such a high impedance can prevent the deterioration of the reflection characteristic due to the structural discontinuity, in the same manner as in the high impedance portion 30 in the first embodiment.

In the second embodiment of the present invention, contrary to the first embodiment, it is not necessary to narrow the width of the strip conductor pattern for obtaining the effect. Thus, the problems such as that an increase of the transmission loss or a requirement of the width of the strip conductor pattern smaller than the lowest limit of pattern forming do not appear.

As explained above, according to the second embodiment, it is possible to increase the equivalent characteristic impedance at the region near to the discontinuous structure portion where the flow direction of the high frequency current turns by 90 degrees, without narrowing the width of the strip conductor pattern. Therefore, it is possible to obtain a strip line feeding apparatus having a good reflection characteristic in the high frequency region, without narrowing the width of the strip conductor pattern. It can be fabricated easily, and simultaneously the high reliability of the strip line feeding apparatus can be assured.

Embodiment 3

Figure 9:
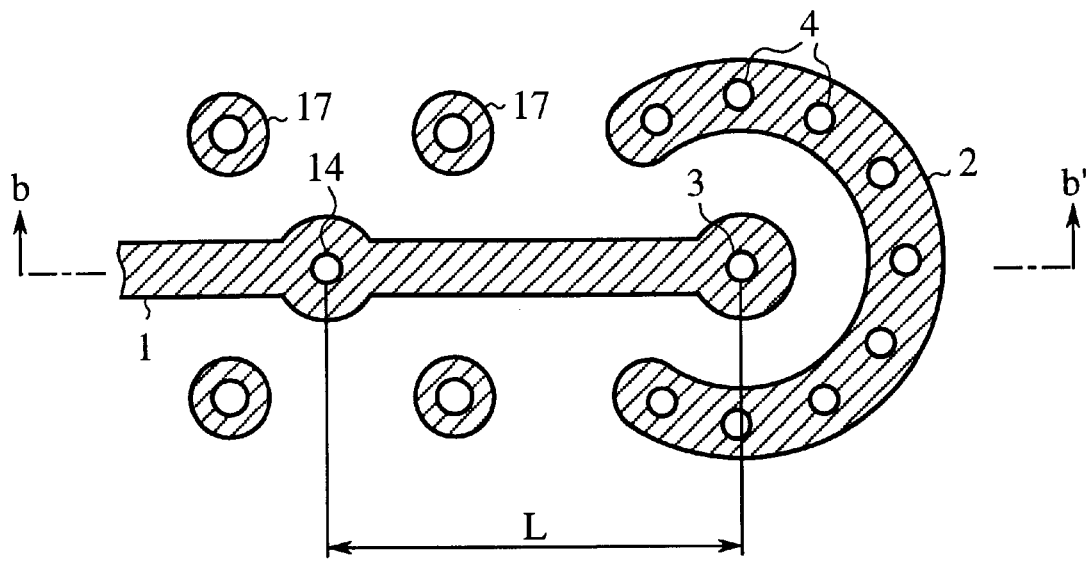
FIG. 9 is a plan view of an example of conductor patterns, such as the strip conductor pattern, disposed at the under surface of the first dielectric substrate, of the strip line feeding apparatus of the third embodiment.
Figure 10:
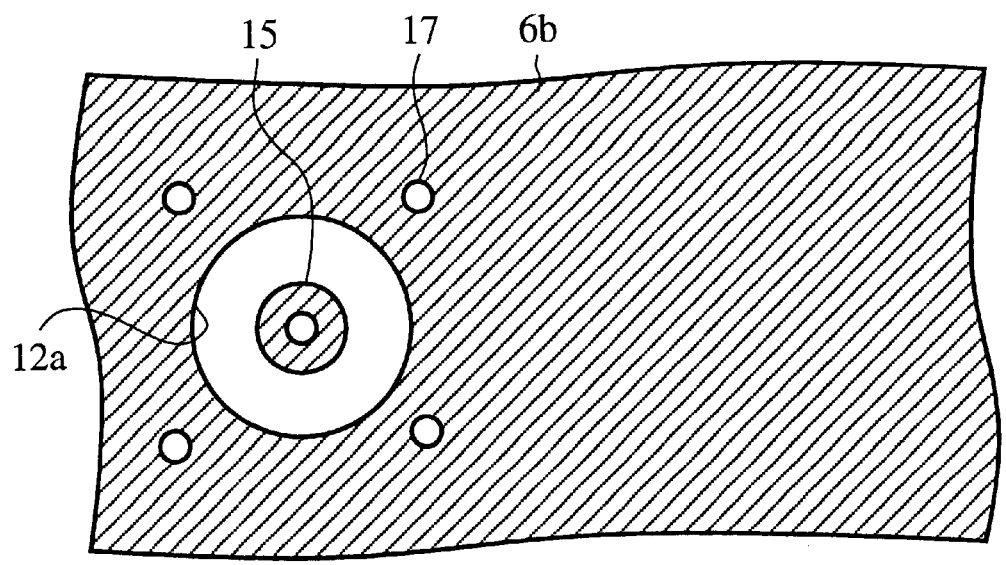
FIG. 10 is a plan view of the conductor patterns, such as the ground conductor patterns, disposed on the under surface of the second dielectric substrate, in the strip line feeding apparatus according to the third embodiment of the present invention.

A strip line feeding apparatus according to the third embodiment of the present invention is explained below, referring to FIGS. 8–10.

Figure 8:
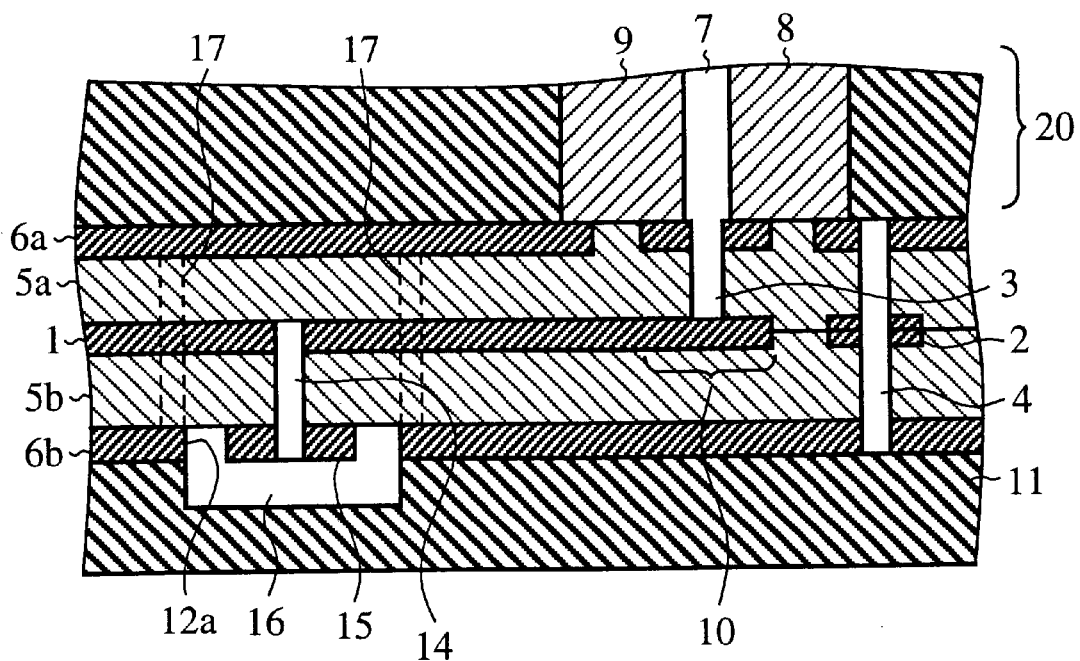
FIG. 8 is a cross sectional view of the strip line feeding apparatus according to the third embodiment of the present invention.

FIG. 8 is a cross sectional view of a strip line feeding apparatus according to the third embodiment. FIG. 9 is a plan view of the conductor patterns on the under surface of the first dielectric substrate 5a in FIG. 8. FIG. 8 shows the cross sectional structure of FIG. 9, along the line b—b'. FIG. 10 is a front view of the conductor patterns on the under surface of the second dielectric substrate 5b. Components in these figures identical to or equivalent to those in FIGS. 1–3 are referred to the same reference numerals. And their explanations are omitted.

Reference numerals 12a, 16 denote, respectively, a hole disposed in the ground conductor pattern 6b, a recess disposed in the chassis 11 in the region of the hole 12a. Reference numeral 15, 14 denote, respectively, a land pattern disposed in the hole 12a, and a matching through-hole disposed in the second substrate 5b. One end of the through-hole 14 is connected to the strip conductor pattern 1 at a point distant from the tip portion 10 of the strip conductor pattern 1 by a distance L, and the other end thereof is connected to the land pattern 15. Short circuiting through-holes 17 are disposed around the matching through-hole 14 so that the ground conductor patterns 6a, 6b on the upper and under surfaces of the pair of the dielectric substrates 5a, 5b are electrically connected to each other.

A capacitive susceptance appears at the portion where the central conductor 7 of the coaxial connector is connected to the strip conductor pattern 1 through the through-hole for inner conductor 3. And the capacitive susceptance causes a reflection at the connecting portion.

However the capacitive susceptance can be compensated by the matching through-hole 14 and the land pattern 15, which act as a capacitive element disposed in parallel with the strip line, when the distance L from the tip 10 of the strip conductor pattern to the matching through-hole 14 is designed to be substantially a quarter of the using wave length, and the area of the land pattern 15 is designed to be appropriate. Therefore, the reflection characteristic can be improved.

The matching through-hole 14 may excite a parallel plane mode electromagnetic wave, due to the asymmetric structure of the strip line. However the wave does not propagate, because the short circuiting through-holes 17 disposed around the matching through-hole 14 connects the upper surface ground conductor 6a and the under surface ground conductor 6b so that their electric potentials are equal.

A large parallel capacity can be obtained by a land pattern 15 with large dimensions, in this structure. Therefore, even when the reflection by the discontinuous structure at the tip portion 10 of the strip conductor pattern is large, the reflection can be canceled out by the large parallel capacity. Thus, the reflection characteristic can be improved.

As explained above, according to the third embodiment, even when the reflection by the discontinuous structure at a portion where the flow direction of the high frequency current turns by 90 degrees may be large, a good reflection characteristic can be obtained.

Embodiment 4

Figure 12:
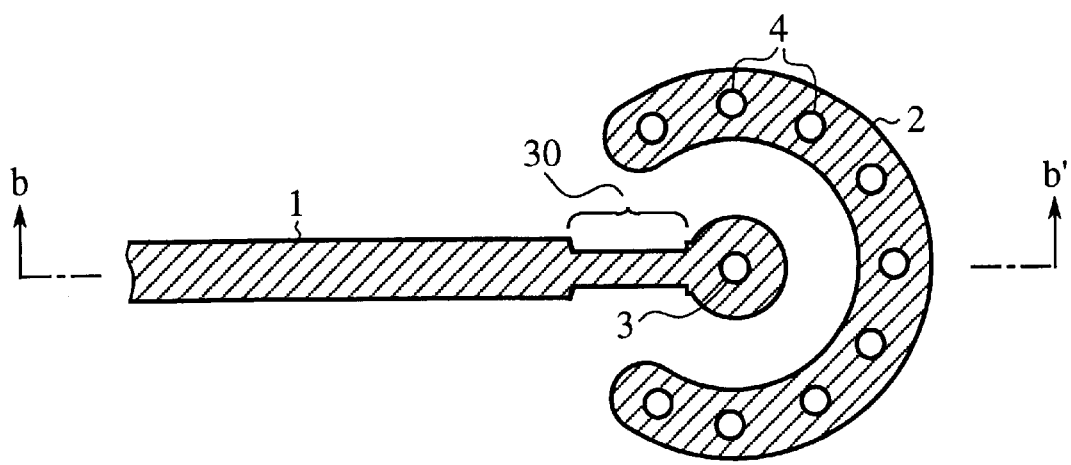
FIG. 12 is a plan view of an example of conductor patterns, such as the strip conductor pattern, disposed at the under surface of the first dielectric substrate, of the strip line feeding apparatus of the fourth embodiment.
Figure 13:
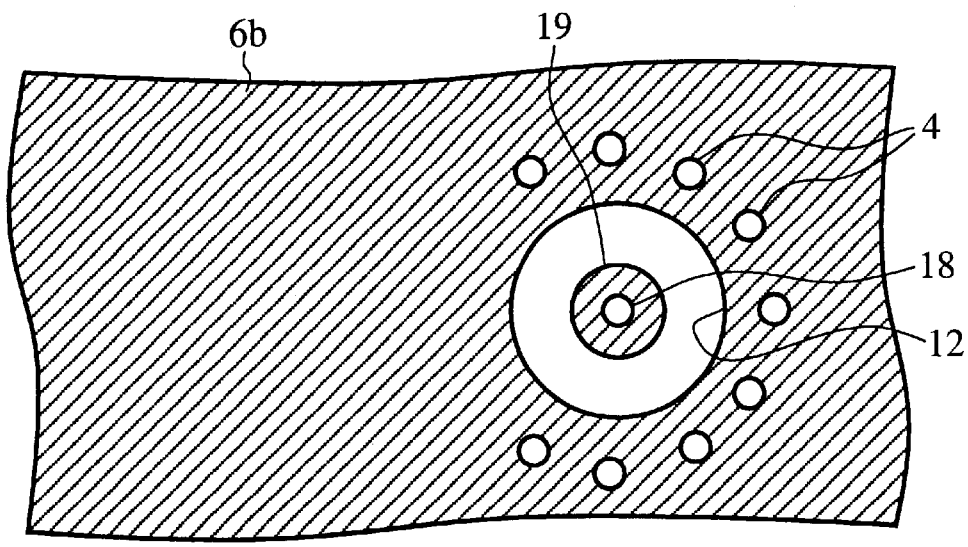
FIG. 13 is a plan view of the conductor patterns, such as the ground conductor patterns, disposed on the under surface of the second dielectric substrate, in the strip line feeding apparatus according to the fourth embodiment of the present invention.

A strip line feeding apparatus according to the fourth embodiment of the present invention is explained below, referring to FIGS. 11–13.

Figure 11:
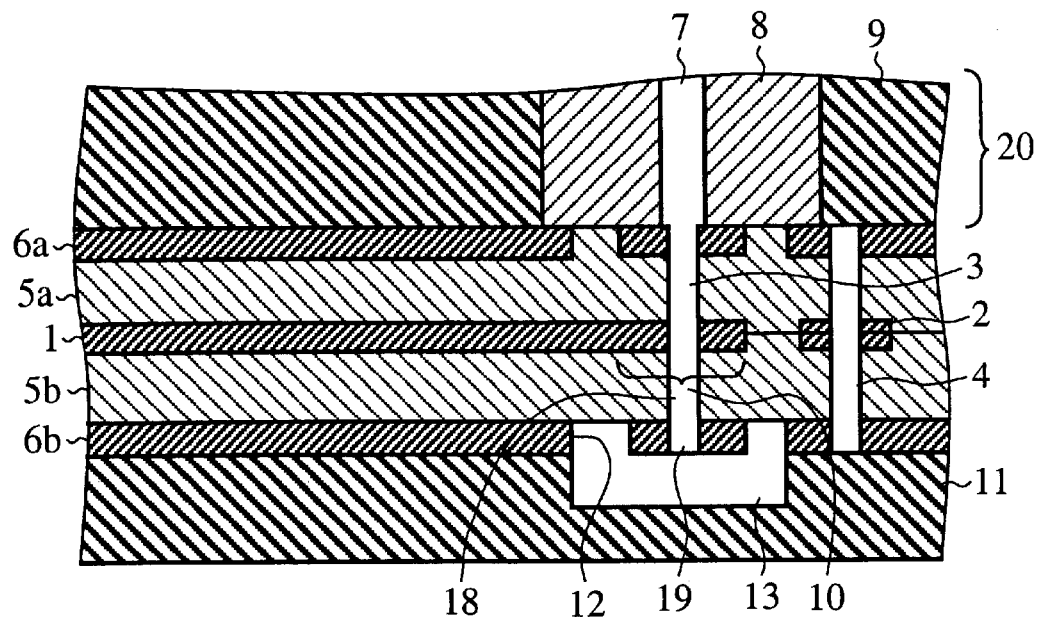
FIG. 11 is a cross sectional view of the strip line feeding apparatus according to the fourth embodiment of the present invention.

FIG. 11 is a cross sectional view of a strip line feeding apparatus according to the fourth embodiment. FIG. 12 is a plan view of the conductor patterns on the under surface of the first dielectric substrate 5a in FIG. 11. FIG. 11 shows the cross sectional structure of FIG. 12, along the line b—b'. FIG. 13 is a front view of the conductor patterns on the under surface of the second dielectric substrate 5b. Components in these figures identical to or equivalent to those in FIGS. 2, 5–7 are referred to the same reference numerals. And their explanations are omitted.

In these figures, reference numerals 18, 19 denote, respectively, an elongated portion of the through-hole for inner conductor, and a land pattern.

The through-hole for inner conductor. 3 of the fourth embodiment penetrates the strip conductor pattern 1 and has an elongated portion 18, which is connected to the land pattern 19 disposed on the under surface of the second dielectric substrate 5b.

In this embodiment, a high impedance portion 30 is disposed near to the tip portion 10 of the strip conductor 1. It is a portion of the strip conductor pattern 1, where the width thereof is narrower compared to the other portions, so that the characteristic impedance is increased.

In this structure, the through-hole for inner conductor 3 for use of the connection of the central conductor 7 of the coaxial connector 20 to the strip conductor pattern 1 penetrates the layered dielectric substrates 5a, 5b and reaches to the land pattern 19. Therefore, the central conductor 7 of the coaxial connector 20 can be connected easily to the strip conductor pattern 1, when solder is poured into the through-hole from the land pattern 19 disposed on the under surface of the second dielectric substrate 5b, after inserting the tip of the central conductor 7 of the coaxial connector 20 into the through-hole for inner conductor 3 and into the elongated portion 18 of the through-hole for inner conductor. Thus, the coaxial connector and the strip conductor can be easily and securely connected.

In -this structure, the elongated portion 18 of the through-hole for inner conductor 3 and the land pattern 19 act as a parallel capacity connected to the tip portion 10 of the strip conductor pattern 1. Simultaneously, a parasite susceptance appears due to the discontinuous structure at the connecting portion of the through-hole for inner conductor 3 and the strip conductor pattern 1. However the sum of the parallel capacity and the parasite susceptance can be cancelled out by the impedance at the high impedance portion 30. As a result, a good reflection characteristic can be obtained.

As explained above, according to the fourth embodiment, the coaxial connector can be easily and securely fixed to the strip line. And simultaneously, a strip line feeding apparatus having a good reflection characteristic can be obtained.

Embodiment 5

Figure 15:
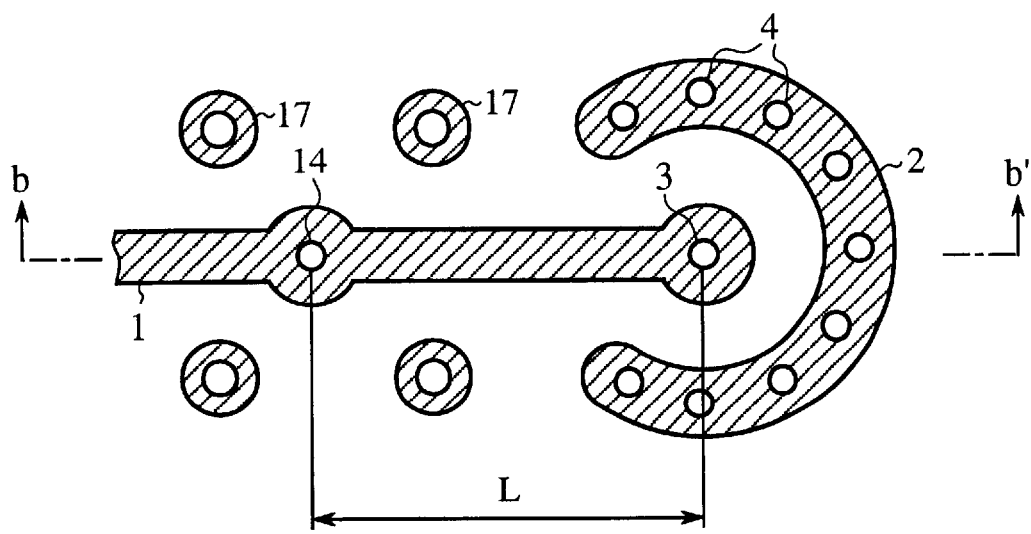
FIG. 15 is a plan view of an example of conductor patterns, such as the strip conductor pattern, disposed at the under surface of the first dielectric substrate, of the strip line feeding apparatus of the fifth embodiment.
Figure 16:
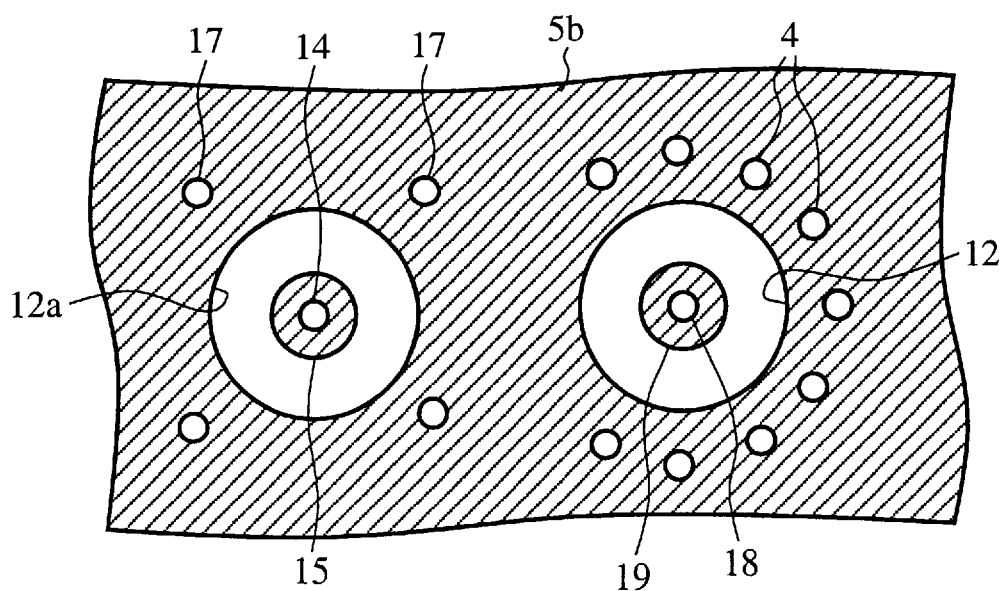
FIG. 16 is a plan view of the conductor patterns, such as the ground conductor patterns, disposed on the under surface of the second dielectric substrate, in the strip line feeding apparatus according to the fifth embodiment of the present invention.

A strip line feeding apparatus according to the fifth embodiment of the present invention is explained below, referring to FIGS. 14–16.

Figure 14:
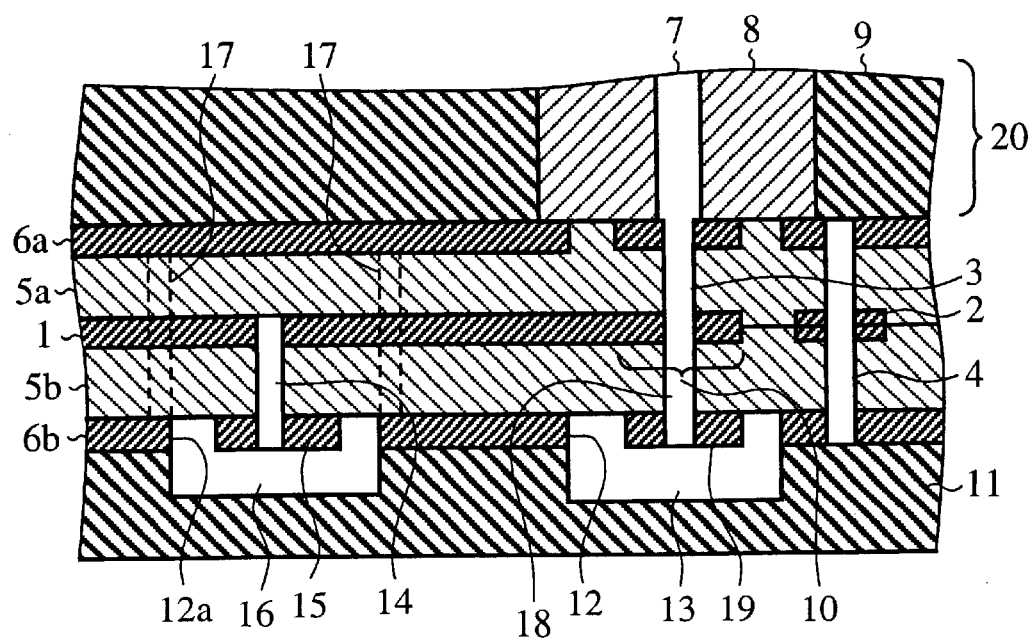
FIG. 14 is a cross sectional view of the strip line feeding apparatus according to the fifth embodiment of the present invention.

FIG. 14 is a cross sectional view of a strip line feeding apparatus according to the fifth embodiment. FIG. 15 is a plan view of the conductor patterns on the under surface of the first dielectric substrate 5a in FIG. 14. FIG. 14 shows the cross sectional structure of FIG. 15, along the line b—b'. FIG. 16 is a front view of the conductor patterns on the under surface of the second dielectric substrate 5b. Components with reference numerals 1 to 13, and 22 correspond to those referred to the same reference numerals in FIG. 5–7. And components with reference numerals 14 to 19 correspond to those referred to the same reference numerals in FIG. 8–13.

In this embodiment, the recess 13 in the third embodiment and the recess 16 in the fourth embodiment are disposed in the chassis 11. And the hole 12a and the land pattern 15 in the third embodiment and the circular hole 12 and the land pattern 19 in the fourth embodiment are disposed in the second ground conductor pattern 6b.

The elongated portion 18 of the through-hole for inner conductor 3 and the land pattern 19 act as a parallel capacity connected to the tip portion 10 of the strip conductor pattern 1. Simultaneously, a parasite susceptance appears due to the discontinuous structure at the connecting portion of the through-hole for inner conductor 3 and the strip conductor pattern 1. However the sum of the parallel capacity and the parasite susceptance can be cancelled out as follows.

In this structure, the matching through-hole 14 and the land pattern 15 act as a capacitor connected with the strip line in parallel.

Thus, when the distance L from the tip 10 of the strip conductor pattern to the matching through-hole 14 is designed to be about a quarter of the using wave length, and when appropriate dimensions are given to the land patterns 15, 19, the reflection at the tip portion 10 of the strip conductor pattern and the reflection at the matching through-hole 14 are cancelled out to each other. As a result, a good reflection characteristic can be obtained.

As explained above, according to the fifth embodiment, the coaxial connector and the strip line can be easily and securely connected, and simultaneously a good reflection characteristic can be obtained.

Embodiment 6

A strip line feeding apparatus according to the sixth embodiment of the present invention is explained below, referring to FIGS. 17–20.

Figure 17:
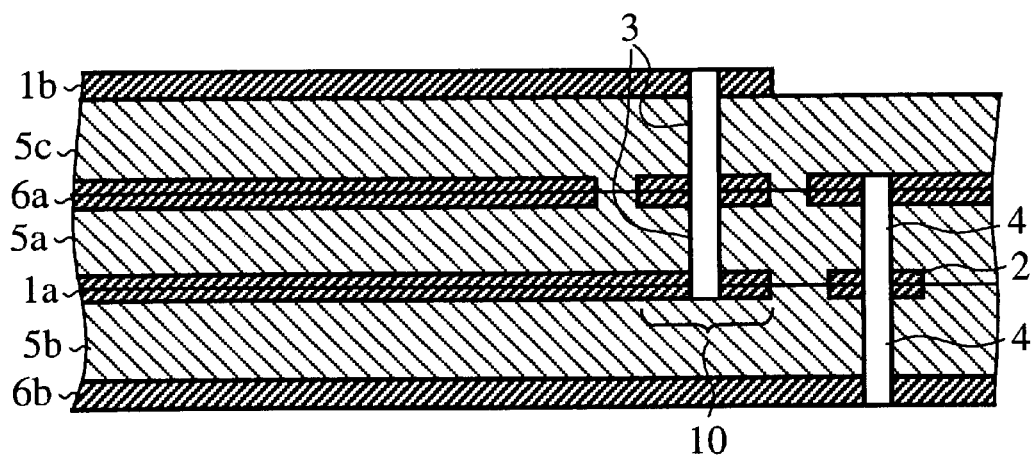
FIG. 17 is a cross sectional view of the strip line feeding apparatus according to the sixth embodiment of the present invention.
Figure 18:
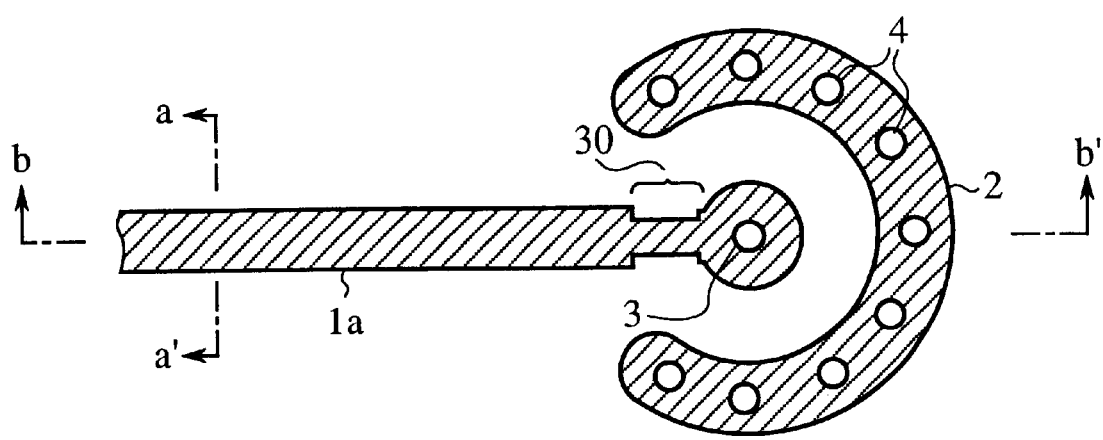
FIG. 18 is a plan view of an example of conductor patterns, such as the strip conductor pattern, disposed at the under surface of the first dielectric substrate, of the strip line feeding apparatus of the sixth embodiment.
Figure 19:
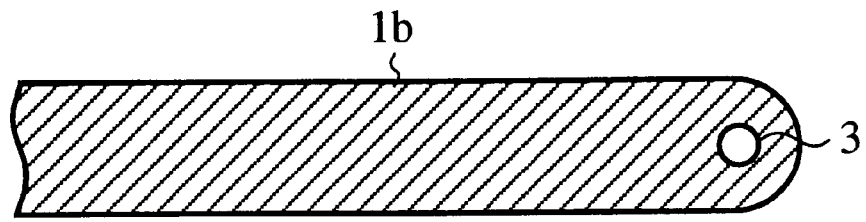
FIG. 19 is a plan view of the conductor patterns of a micro strip line, in the strip line feeding apparatus according to the sixth embodiment of the present invention.
Figure 20:
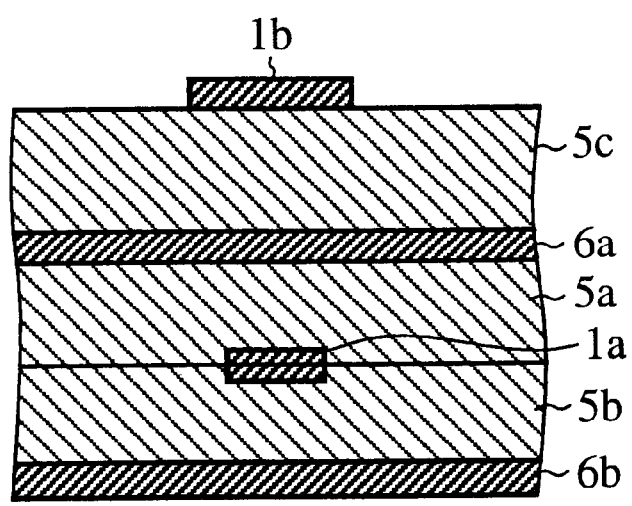
FIG. 20 is a cross sectional view of the strip line feeding apparatus of the sixth embodiment, along the line a—a' in FIG. 18

FIG. 17 is a cross sectional view of a strip line feeding apparatus according to the sixth embodiment, in which high frequency signals are transmitted between a micro strip line in a layer and a strip line in another layer. FIG. 18 is a plan view of the conductor patterns on the under surface of the first dielectric substrate 5a in FIG. 17. FIG. 17 shows the cross sectional structure of FIG. 18, along the line b—b'. FIG. 19 is a front view of the conductor patterns on the upper surface of the third dielectric substrate 5c shown in FIG. 17. FIG. 20 is a cross sectional view of FIG. 18, along the line a—a'.

Components identical to or corresponding to those in FIGS. 1–3 are referred to the same reference numerals. And their explanations are omitted.

In FIGS. 17–20, a first strip conductor pattern 1a is disposed on one surface of the first conductor 5a, and a second strip conductor pattern 1b is disposed on a third dielectric substrate 5c. The first strip conductor pattern 1a in the embodiments 6–10 corresponds to the strip conductor pattern 1 in the embodiments 1–5.

In this embodiment, the first strip conductor pattern 1a, first and second dielectric substrates 5a, 5b and the first and second ground conductor patterns 6a, 6b form a strip line. And the second strip conductor pattern 1b, the third dielectric substrate 5c and the first ground conductor pattern 6a form a micro strip line. The tip portions of the strip line and that of the micro strip line are arranged at corresponding positions on the upper and under surfaces of the layered dielectric substrates 5a, 5c so that one is positioned over the other. And they are connected to each other through the through-hole for inner conductor 3.

The first and second ground conductor patterns 6a, 6b are connected to each other through the through-holes for outer conductor 4, which are disposed around the through-hole for inner conductor 3. The through-holes 3, 4 form a quasi coaxial line. The strip line, the micro strip line and the quasi coaxial line have nearly equal characteristic impedance, so that a high frequency signal can be transmitted between the strip line and the micro strip line. A high impedance portion 30, where the characteristic impedance is higher than that of the other parts, is formed near to the tip portion 10 of the first strip conductor pattern 1a in the strip line. The width of the strip conductor pattern at the high impedance portion is smaller than the other parts In this structure, there are structural discontinuities between the first strip conductor pattern 1a and the through-hole for inner conductor 3, and between the second strip conductor pattern 1b and the through-hole for inner conductor 3, as is in the first embodiment. The structural discontinuity causes a parasite parallel capacitive susceptance. The high impedance portion 30 acts equivalently as a serial inductive capacitance element. Therefore, the parallel capacitive susceptance and the serial inductive impedance can be cancelled out to each other, by designing the dimensions of the high impedance portion 30 to be appropriate values. As a result, the reflection characteristic of the strip line feeding apparatus can be improved.

The high impedance portion 30 can be formed near to the tip portion 10 of the second strip conductor pattern 1b in the micro strip line, by narrowing the width of the strip conductor pattern 1b than the other part, so that the characteristic impedance is higher than that of the other parts.

As explained above, high frequency signals can be easily transmitted between the strip line in a layer and the micro strip line in another layer, and simultaneously a good reflection characteristic can be obtained.

Embodiment 7

A strip line feeding apparatus according to the seventh embodiment of the present invention is explained below, referring to FIGS. 21–23.

Figure 21:
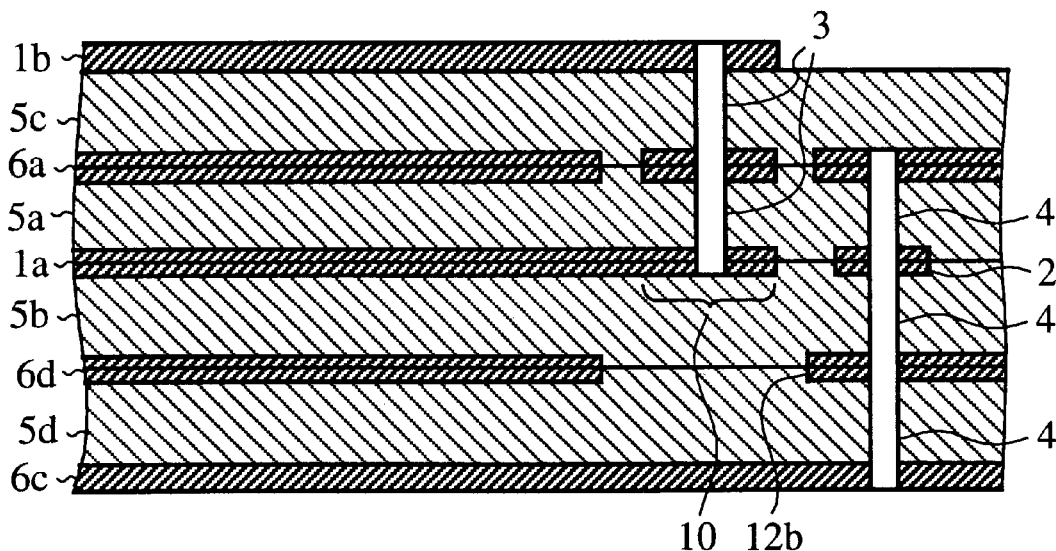
FIG. 21 is a cross sectional view of the strip line feeding apparatus according to the seventh embodiment of the present invention.

FIG. 21 is a cross sectional view of a strip line feeding apparatus according to the seventh embodiment, in which high frequency signals are transmitted between a strip line in a layer and a micro strip line in another layer.

Figure 22:
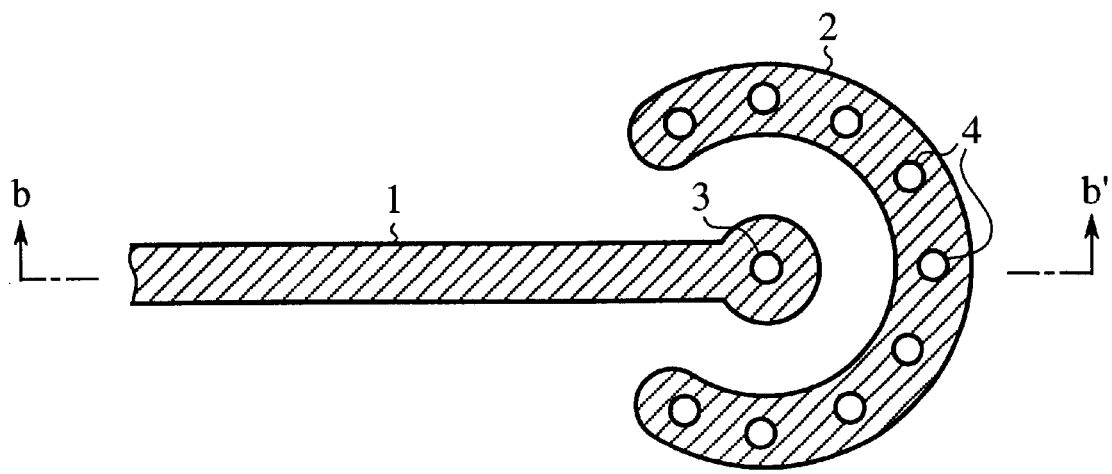
FIG. 22 is a plan view of an example of conductor patterns, such as the strip conductor pattern, disposed at the under surface of the first dielectric substrate, of the strip line feeding apparatus of the seventh embodiment.

FIG. 22 is a plan view of the conductor patterns on the under surface of the first dielectric substrate 5a in FIG. 21. FIG. 21 shows the cross sectional structure of FIG. 22, along the line b—b'.

Figure 23:
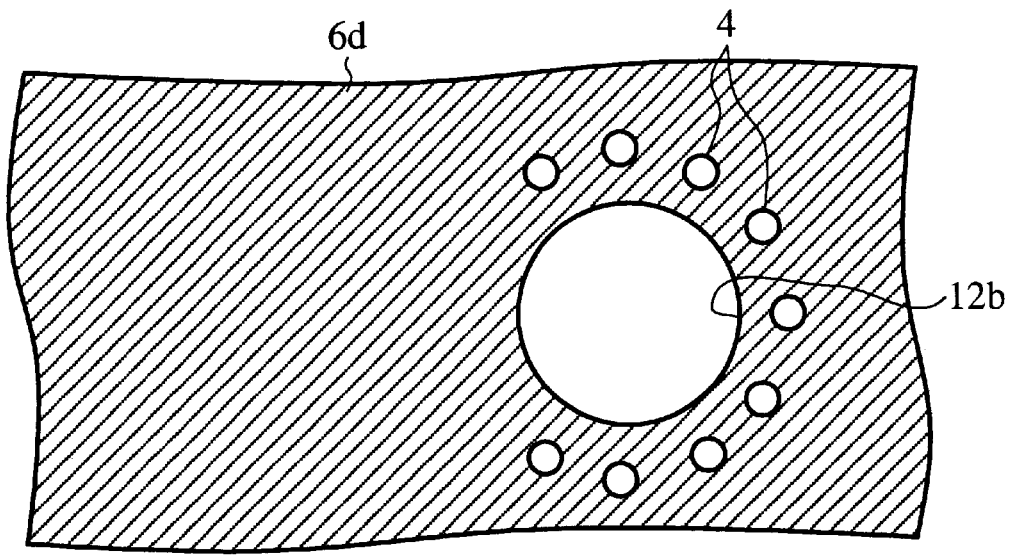
FIG. 23 is a plan view of the conductor patterns, such as the ground conductor patterns, disposed on the under surface of the second dielectric substrate, in the strip line feeding apparatus according to the seventh embodiment of the present invention.

FIG. 23 is a front view of the conductor patterns on the under surface of the second dielectric substrate 5b shown in FIG. 21.

Components identical to or corresponding to those in FIGS. 17–20 are referred to the same reference numerals. And their explanations are omitted.

In FIGS. 21, a hole 12b is disposed in the fourth ground conductor pattern 6d at an area just under the through-hole for inner conductor 3. The fourth ground conductor pattern 6d corresponds to the second ground conductor pattern 6b. A fourth dielectric substrate 5d is disposed under the fourth ground pattern 6d. And a third ground conductor patterns 6c is disposed on the under surface of the fourth dielectric substrate 5d.

The through-hole for outer conductor 4 penetrates the fourth ground conductor pattern 6d and reaches to the third ground conductor pattern 6c. The third and fourth ground conductor patterns 6c, 6d are electrically connected to each other through the elongated through-holes for outer conductor 4.

The third conductor pattern 6c prevents the leakage of a high frequency signal from the hole 12b disposed in the fourth ground conductor pattern 6d.

In this structure, a high impedance portion can be disposed without changing the width of the strip conductor pattern 1a, in the same manner as in the second embodiment. Therefore, the reflection characteristic can be improved, without using a high impedance portion 30 which is a narrowed portion of the strip line as shown in FIG. 18. And the leakage of the high frequency signal from the hole 12b disposed in the fourth ground conductor 6d can be prevented by the third ground conductor pattern 6c. Advantages same to the sixth embodiment can be obtained.

As explained above, according to the seventh embodiment, a good reflection characteristic in the high frequency signal transmission between a micro strip line in a layer and a strip line in another layer can be obtained, without using a narrowed width strip line.

Embodiment 8

A strip line feeding apparatus according to the eighth embodiment of the present invention is explained below, referring to FIGS. 24–26.

Figure 24:
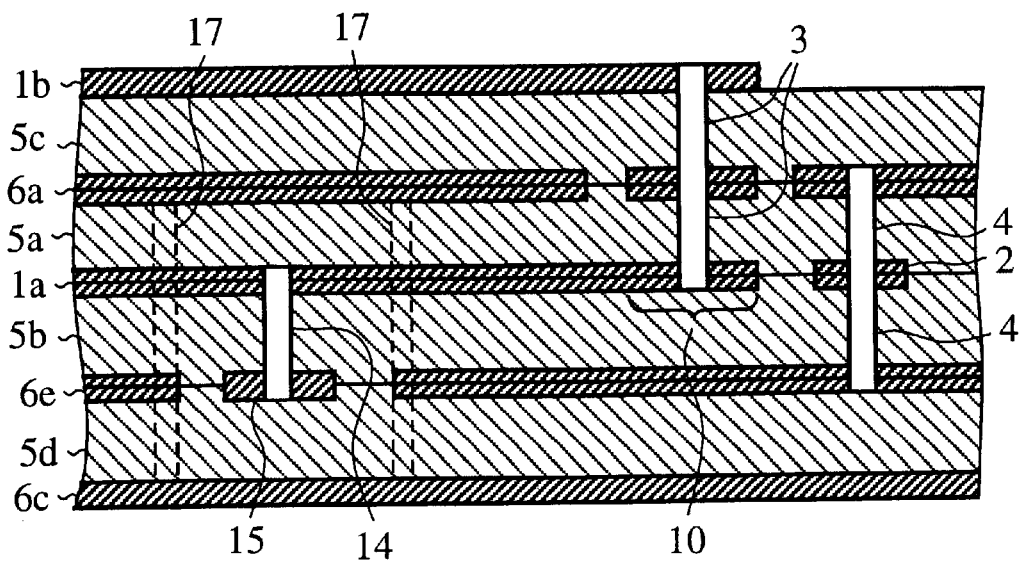
FIG. 24 is a cross sectional view of the strip line feeding apparatus according to the eighth embodiment of the present invention.

FIG. 24 is a cross sectional view of a-strip line feeding apparatus according to the eighth embodiment, in which high frequency signals are transmitted between a strip line in a layer and a micro strip line in another layer.

Figure 25:
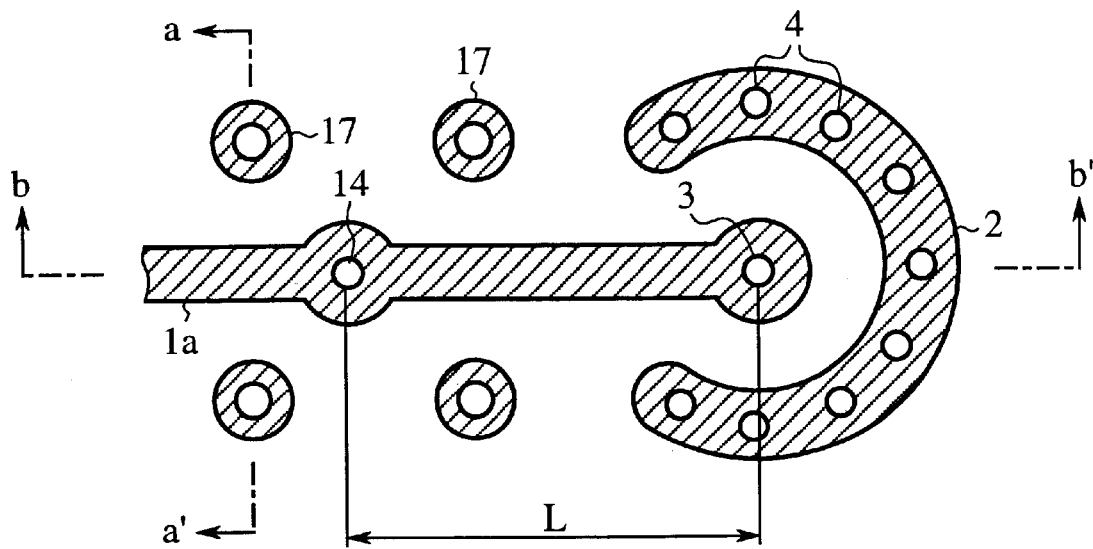
FIG. 25 is a plan view of an example of conductor patterns, such as the strip conductor pattern, disposed at the under surface of the first dielectric substrate, of the strip line feeding apparatus of the eighth embodiment.

FIG. 25 is a plan view of the conductor patterns on the under surface of the first dielectric substrate 5a in FIG. 24. FIG. 24 shows the cross sectional structure of FIG. 25, along the line b—b'.

Figure 26:
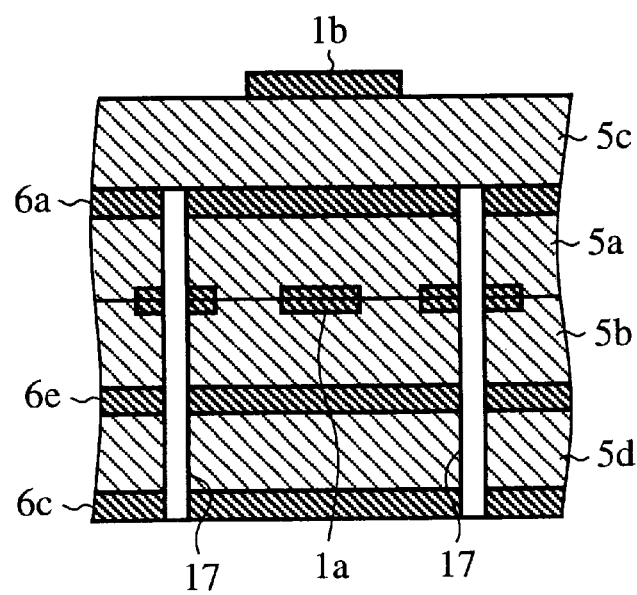
FIG. 26 is a cross sectional view of the strip line feeding apparatus of the eighth embodiment, along the line a—a' in FIG. 25.

FIG. 26 is a cross sectional view of FIG. 25, along the line b–b'.

Components in FIGS. 24–26 identical to or corresponding to those in FIGS. 17–20 are referred to the same reference numerals. And their explanations are omitted.

In this embodiment, the high impedance portion 30 is not disposed in the strip conductor pattern 1a. A fourth dielectric substrate 5d is disposed under a fifth ground conductor pattern 6e, which is disposed on the under surface of the second dielectric substrate 5b. The fifth ground conductor pattern 6e corresponds to the second ground conductor pattern 6b. And a third ground conductor pattern 6c is disposed on the under surface of the fourth dielectric substrate 5d.

A land pattern 15 is disposed on the under surface of the second dielectric substrate 5b. A matching through-hole 14 is disposed in the second dielectric substrate 5b, one end of which is connected with the first strip conductor pattern 1a at a region separated from the tip portion 10 of the pattern 1a by a distance L, and the other end is connected with the land pattern 15. A plurality of short circuiting through-holes 17 are disposed around the matching through-hole- 14 so that the first, third and fifth ground conductor patterns 6a, 6c and 6e are mutually connected by these short circuiting through-holes 17.

A reflection of the high frequency signal appears at the connecting portion of the through-hole for inner conductor 3 and the first and second conductor patterns 1a, 1b, due to the discontinuity of the structure. However, when the distance L between the tip portion 10 of the strip conductor pattern 1a and the matching through-hole 14 is selected to be about a quarter of the using wave length, and the dimensions of the land pattern 15 is designed to be appropriate, the reflection can be cancelled out by the capacitive element, which is formed by the matching through-hole 14 and the land pattern 15. Therefore, the reflection characteristic can be improved.

As explained above, according to the eighth embodiment, a good reflection characteristic can be obtained in the high frequency signal transmission between the micro strip line and the strip line.

Embodiment 9

A strip line feeding apparatus according to the ninth embodiment of the present invention is explained below, referring to FIGS. 27–29.

Figure 27:
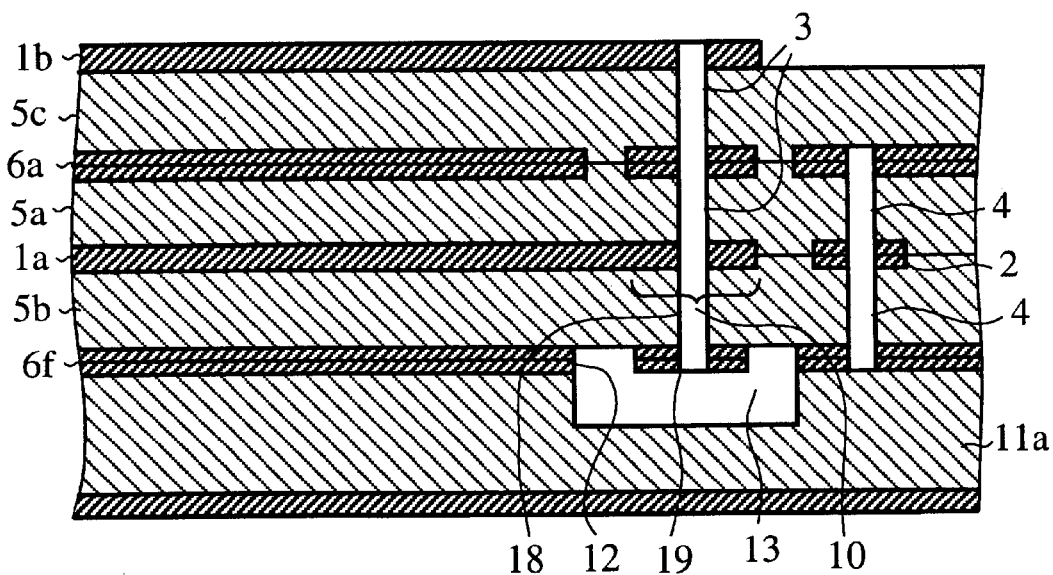
FIG. 27 is a cross sectional view of the strip line feeding apparatus according to the ninth embodiment of the present invention.

FIG. 27 is a cross sectional view of a strip line feeding apparatus according to the ninth embodiment, in which high frequency signals are transmitted between a micro strip line in a layer and a strip line in another layer.

Figure 28:
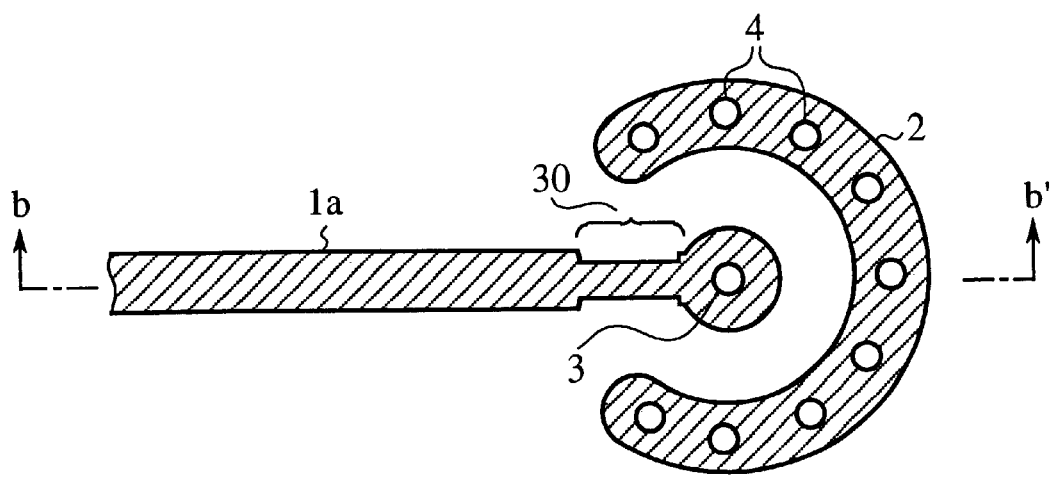
FIG. 28 is a plan view of an example of conductor patterns, such as the strip conductor pattern, disposed at the under surface of the first dielectric substrate, of the strip line feeding apparatus of the ninth embodiment.

FIG. 28 is a plan view of the conductor patterns on the under surface of the first dielectric substrate 5a in FIG. 27. FIG. 27 shows the cross sectional structure of FIG. 28, along the line b—b'.

Figure 29:
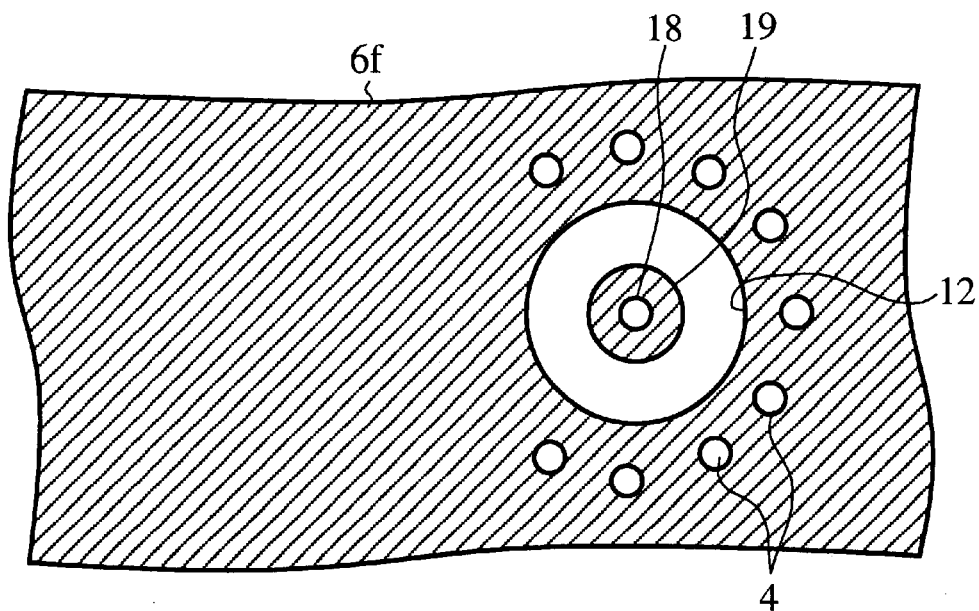
FIG. 29 is a plan view of the conductor patterns, such as the ground conductor patterns, disposed on the under surface of the second dielectric substrate, in the strip line feeding apparatus according to the ninth embodiment of the present invention.

FIG. 29 is a cross sectional view of a plan view of the conductor pattern on the under surface of the second dielectric substrate 5b shown in FIG. 27.

Components in FIGS. 27–29 identical to or corresponding to those in FIGS. 17–20 are referred to the same reference numerals. And their explanations are omitted.

A sixth ground conductor pattern 6f is disposed on the under surface of the second dielectric substrate 5b. A chassis 11a has a recess 13 at a region just under the through-hole for inner conductor 3. An elongated portion 18 of the through-hole for inner conductor 3 reaches to the under surface of the second dielectric substrate 5b and is electrically connected with the land pattern 19.

In this structure, the elongated portion 18 of the through-hole for inner conductor 3 and the land pattern 19 act equivalently as a parallel capacitive element connected to the tip portion 10 of the first strip conductor pattern 1a. Simultaneously a parasite capacitive susceptance appears at the discontinuous structure between the through-hole for inner conductor 3 and the first strip conductor pattern 1a. However, the capacitance of the equivalent capacitive element and the capacitive susceptance can be cancelled out by the impedance of the high impedance portion 30, when the dimensions of the high impedance portion 30 is designed appropriately, in the same manner as in the fourth embodiment. And a good reflection characteristic can be obtained.

The through-hole for inner conductor 3 (including its elongated portion 18) penetrates all the dielectric substrates 5a, 5b, 5c. Therefore, when the through-hole for inner conductor 3 (including its elongated portion 18) is made by boring the substrates 5a, 5b, 5c, after they are combined to each other, the first and second strip conductor patterns 1a, 1b and the land pattern 19 can be easily connected, by soldering the inner conductor 3 (including its elongated portion 18). That is to say the inter-layer connection is easy in this embodiment.

As explained above, according to the ninth embodiment, an advantage is obtained in that the inter-layer connection is easy.

Embodiment 10

A strip line feeding apparatus according to the tenth embodiment of the present invention is explained below, referring to FIGS. 30–32.

Figure 30:
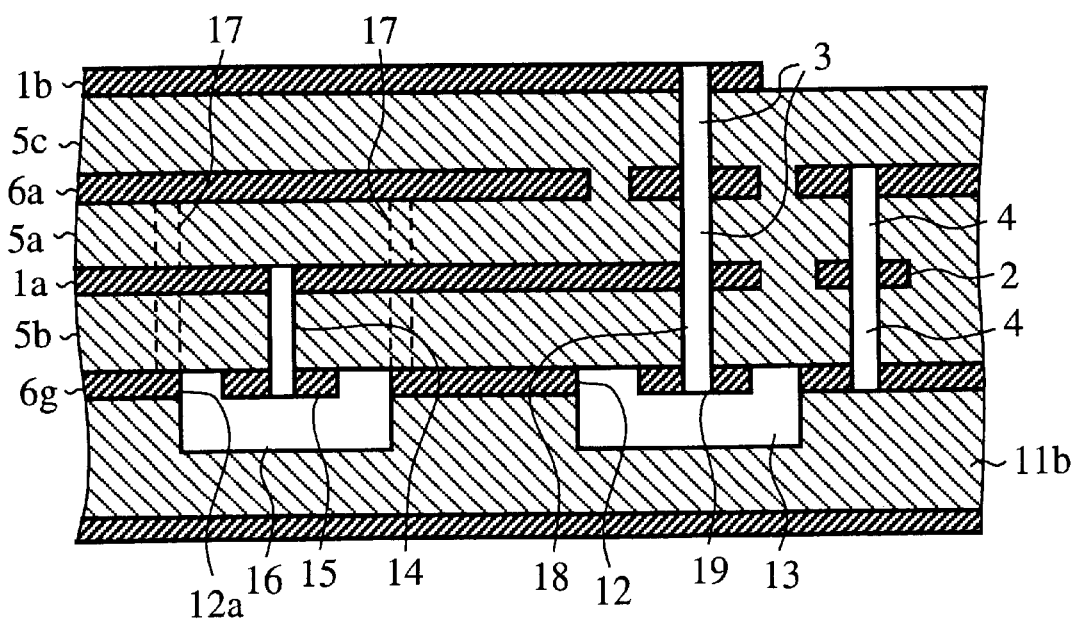
FIG. 30 is a cross sectional view of the strip line feeding apparatus according to the tenth embodiment of the present invention.

FIG. 30 is a c ross sectional view of a strip line feeding apparatus according to the tenth embodiment, in which high frequency signals are transmitted between a micro strip line in a layer and a strip line in another layer.

Figure 31:
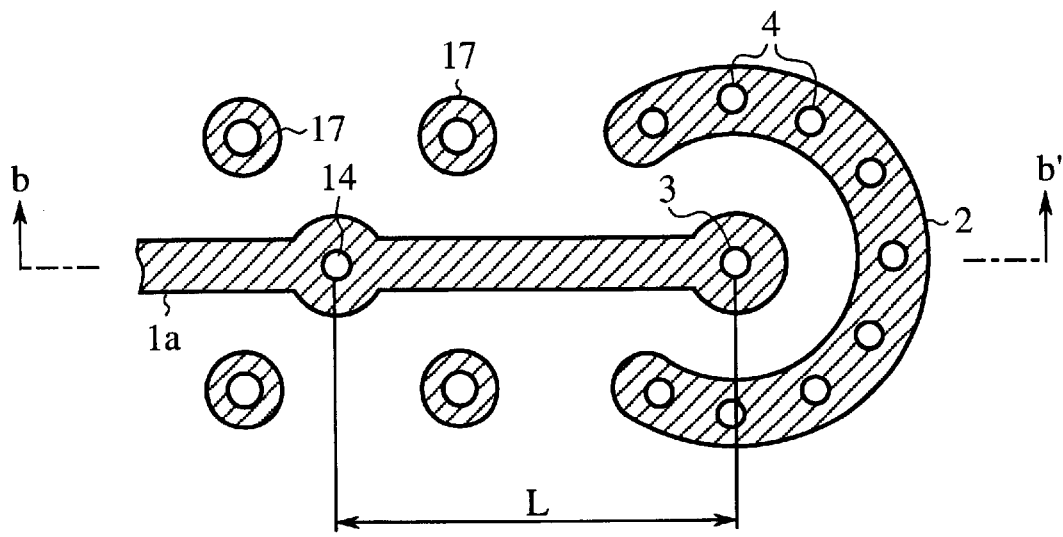
FIG. 31 is a plan view of an example of conductor patterns, such as the strip conductor pattern, disposed at the under surface of the first dielectric substrate, of the strip line feeding apparatus of the tenth embodiment.

FIG. 31 is a plan view of the conductor patterns on the under surface of the first dielectric substrate 5a in FIG. 30. FIG. 30 shows the cross sectional structure of FIG. 31, along the line b—b'.

Figure 32:
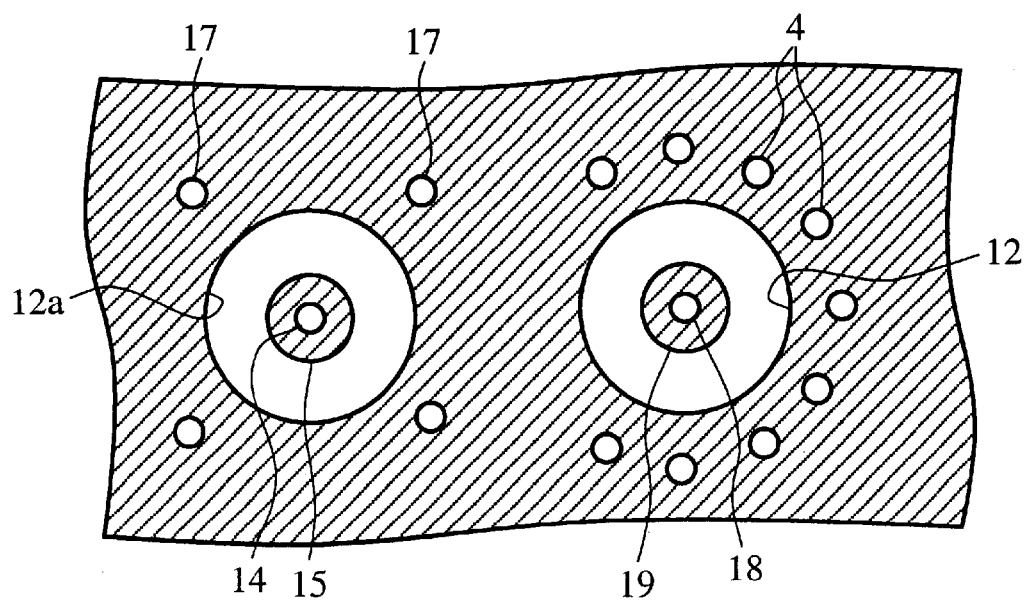
FIG. 32 is a plan view of the conductor patterns, such as the ground conductor patterns, disposed on the under surface of the second dielectric substrate, in the strip line feeding apparatus according to the tenth embodiment of the present invention.
Figure 33:
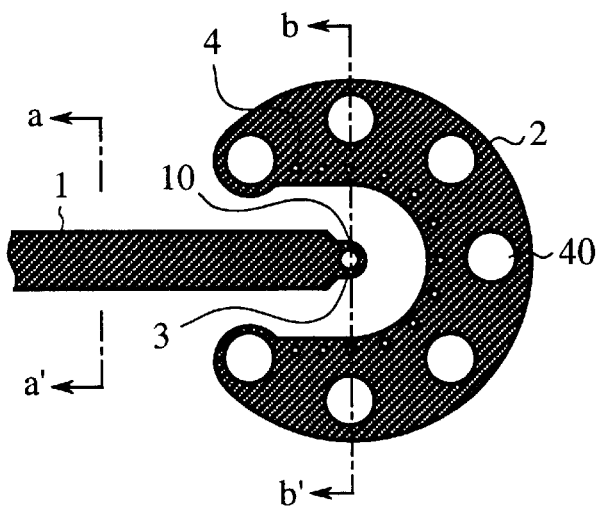
FIG. 33 is a plan view of an example of the strip line feeding apparatus in the prior art.
Figure 34:
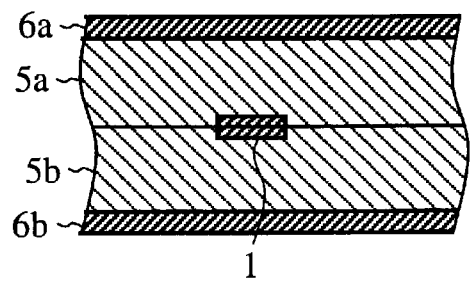
FIG. 34 is a cross sectional views of FIG. 33, along the lines a—a'.
Figure 35:
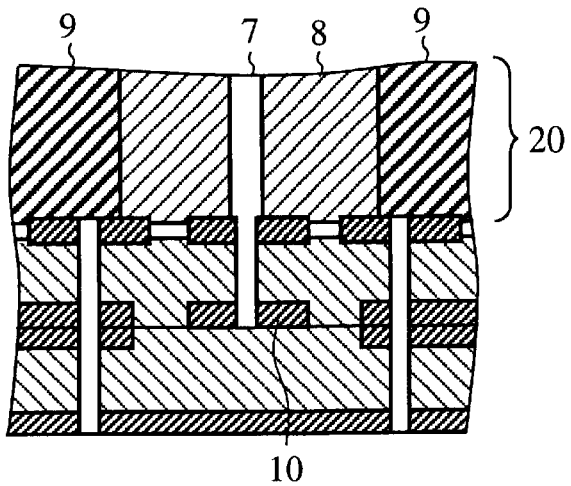
FIG. 35 is a cross sectional views of FIG. 33, along the lines b—b'.

FIG. 32 is a cross sectional view of a plan view of the conductor pattern on the under surface of the second dielectric substrate 5b shown in FIG. 27.

Components in FIGS. 30–32 identical to or corresponding to those in FIGS. 24–26 and 27–29 are referred to the same reference numerals. And their explanations are omitted.

A seventh ground conductor pattern 6g is disposed on the under surface of the second dielectric substrate 5b. The seventh ground conductor pattern 6g corresponds to the second ground conductor pattern 6b. A chassis 11b has a recess 16 at a region just under the land pattern 15.

Short circuiting through-holes 17 are disposed around the matching through-hole 14, and connect the first strip conductor pattern 1a and the seventh ground conductor pattern 6g, which are disposed respectively on the upper and under surface of the strip line.

The portion including the matching through-hole 14 and the land pattern 15 act as a capacitive element connected with the strip line in parallel. When the distance L between the tip portion 10 of the first strip conductor pattern 1a and the matching through-hole 14 is designed to be about a quarter of the using wave length, and when the dimensions of the land pattern 19 is appropriate, the reflection at the portion between the tip portion 10 of the first strip conductor portion 1a and the matching through-hole 14 is cancelled out, in the same manner as in the fifth embodiment. Thus, a good reflection characteristic can be obtained.

As explained above, according to the tenth embodiment, an inter-layer connection structure can be easily obtained, using a simple fabrication process of the substrates, simultaneously, a good reflection characteristic can be obtained.

As explained above, according to the tenth embodiment, advantages are obtained in that an inter-layer connection can be carried out using an easy fabrication process of substrates, and simultaneously a good reflection characteristic can be obtained.

What is claimed is:

1. A strip line feeding apparatus comprising:
a first dielectric substrate, on one surface of which a strip conductor pattern is disposed, and on the other surface of which a first ground conductor pattern is disposed;
a second dielectric substrate, on one surface of which a second ground conductor pattern is disposed, the first and the second substrates are disposed one over another so as to form a strip line so that the first and second ground conductor patterns are disposed at the outsides of the strip line;
a through-hole for inner conductor, which is connected with the tip portion of the strip conductor pattern and is penetrating the first dielectric substrate;
through-holes for outer conductor, which are disposed around the through-hole for inner conductor and are connecting the first and second ground conductor pattern disposed on the upper and under surfaces of the strip line;
and a signal feeder comprising a signal conductor and a ground conductor, the signal conductor is electrically connected with the strip conductor pattern through the through-hole for inner conductor, and the ground conductor is electrically connected with the first and second ground pattern through the through-holes for outer conductor;
wherein a serial high impedance portion is disposed near to the connecting portion between the strip conductor pattern and the through-hole for inner conductor, and wherein the through-hole for the inner conductor elongates to penetrate the second dielectric substrate.

2. A strip line feeding apparatus according to claim 1, wherein the high impedance portion is a portion disposed near to the tip portion of the strip conductor pattern, where the width of the strip conductor pattern is narrowed.

3. A strip line feeding apparatus according to claim 1, wherein the high impedance portion is a hole disposed in the area of the second ground conductor of the second dielectric substrate just under the through-hole for inner conductor.

4. A strip line feeding apparatus according to claim 1, wherein the through-holes for outer conductor are disposed around the through-hole for inner conductor so as to form a cylindrical cage.

5. A strip line feeding apparatus according to claim 1, wherein the signal feeder is a coaxial connector, the central conductor of which is inserted into the through-hole for inner conductor from the strip conductor pattern side and is electrically connected with the through-hole for inner conductor, and the outer conductor of the coaxial connector is electrically connected to the first ground conductor pattern through the through-holes for outer conductor.

6. A strip line feeding apparatus according to claim 1, wherein the signal feeder is a micro strip line, which comprises: a third dielectric substrate disposed on the first dielectric substrate at the opposite side of the second dielectric substrate;
a second strip conductor pattern disposed on a surface of the third dielectric substrate at the opposite side of the first ground conductor pattern, wherein
the tip portion of the strip conductor pattern and the tip portion of the second strip conductor pattern are arranged so as that one is over the other, and
the through-hole for inner conductor elongates to penetrate the third dielectric substrate so that tip portion of the second strip conductor pattern is electrically connected with that of the strip conductor pattern.

7. A strip line feeding apparatus according to claim 1, wherein a land pattern, electrically connected with the through-hole for inner conductor, is disposed in the area of the second ground conductor on the under surface of the second dielectric substrate, the land pattern is disconnected from the second ground conductor.

8. A strip line feeding apparatus according to claim 1, further comprising:

a third dielectric substrate, which is disposed under the second dielectric substrate;

and a third ground conductor pattern is disposed on a surface of the third dielectric substrate at the opposite side of the second dielectric substrate, the third ground conductor pattern is electrically connected with the first and second ground patterns.

9. A strip line feeding apparatus comprising:

a first dielectric substrate, on one surface of which a strip conductor pattern is disposed, and on the other surface of which a first ground conductor pattern is disposed;

a second dielectric substrate, on one surface of which a second ground conductor pattern is disposed, the first and the second substrates are disposed one over another so as to form a strip line so that the first and second ground conductor patterns are disposed at the outsides of the strip line;

a through-hole for inner conductor, which is connected with the tip portion of the strip conductor pattern and is penetrating the first dielectric substrate;

through-holes for outer conductor, which are disposed around the through-hole for inner conductor and are connecting the first and second ground conductor pattern disposed on the upper and under surfaces of the strip line;

and a signal feeder comprising a signal conductor and a ground conductor, the signal conductor is electrically connected with the strip conductor pattern through the through-hole for inner conductor, and the ground conductor is electrically connected with the first and second ground pattern through the through-holes for outer conductor;

wherein a matching through-hole, connected with the strip conductor pattern at a point distant from the through-hole for inner conductor by about a quarter of the using wave length, is disposed in the second dielectric substrate, and penetrates the second dielectric substrate, and short circuiting through-holes, which penetrate the first and second dielectric substrates and electrically connect with the first and second ground conductors, are disposed around the matching through-hole.

10. A strip line feeding apparatus according to claim 9, wherein a land pattern, electrically connected with the matching through-hole, is disposed on the under surface of the second dielectric substrate in the area of the second ground conductor under the matching through-hole, the land pattern is disconnected from the second ground conductor.

11. A strip line feeding apparatus according to claim 9, wherein the through-holes for outer conductor are disposed around the through-hole for inner conductor so as to form a cylindrical cage.

12. A strip line feeding apparatus according to claim 9, further comprising:

a third dielectric substrate, which is disposed under the second dielectric substrate;

and a third ground conductor pattern disposed on a surface of the third dielectric substrate at the opposite side of the second dielectric substrate, the third ground conductor pattern is electrically connected with the first and second ground patterns.

13. A strip line feeding apparatus according to claim 9, wherein the signal feeder is a coaxial connector, the central conductor of which is inserted into the through-hole for inner conductor from the first conductor pattern side and is electrically connected with the through-hole for inner conductor, and the outer conductor of the coaxial connector is electrically connected to the first ground conductor pattern through the through-holes for outer conductor.

14. A strip line feeding apparatus according to claim 9, wherein the through-hole for inner conductor elongates to penetrate the second dielectric substrate.

15. A strip line feeding apparatus according to claim 14, wherein a land pattern, electrically connected with the through-hole for inner conductor, is disposed in the area of the second ground conductor on the under surface of the second dielectric substrate, the land pattern is disconnected from the second ground conductor.

16. A strip line feeding apparatus according to claim 9, wherein the signal feeder is a micro strip line, which comprises: a third dielectric substrate disposed on the first dielectric substrate at the opposite side of the second dielectric substrate; and a second strip conductor pattern disposed on a surface of the third dielectric substrate at the opposite side of the first ground conductor pattern, the tip portion of the strip conductor pattern and the tip portion of the second strip conductor pattern are arranged so that one is over the other, the through-hole for inner conductor elongates to penetrate the third dielectric substrate so that the second strip conductor pattern is electrically connected with the strip conductor.

17. A strip line feeding apparatus comprising:

a first dielectric substrate, having a strip conductor pattern fabricated on a first surface thereof, and a first ground conductor pattern fabricated on a second surface thereof;

a second dielectric substrate, having a second ground conductor pattern fabricated on a first surface thereof, the first and the second substrates disposed one over another such that the first surface of the first dielectric substrate and the second surface of the second dielectric substrate are in contact and the first and the second ground conductor patterns are disposed at the outsides of the strip conductor pattern;

a first through-hole connection for an inner conductor, the first through-hole connection connected with and protruding through a hole in a tip portion of the strip conductor pattern, the first through hole connection penetrating the first dielectric substrate; and a plurality of second through-hole connections for an outer conductor, the plurality of second through-hole connections disposed around the first through-hole connection and connected to and connecting the first and the second ground conductor patterns;

wherein a matching third through-hole is connected with the strip conductor pattern at a point located a distance proportional to about a quarter of a wave length or integral multiple thereof of an applied signal, the distance being from the first through-hole, the matching third through hole disposed in the second dielectric substrate, and penetrating the second dielectric substrate, and a plurality of short circuiting fourth through-holes are provided which penetrate the first and second dielectric substrates and are electrically connected with the first and second ground conductors, and are disposed around the matching third through-hole.

18. A strip line feeding apparatus comprising:

a first dielectric substrate, having a strip conductor pattern fabricated on a first surface thereof, and a first ground conductor pattern fabricated on a second surface thereof;

a second dielectric substrate, having a second ground conductor pattern fabricated on a first surface thereof, the first and the second substrates disposed one over another such that the first surface of the first dielectric substrate and the second surface of the second dielectric substrate are in contact and the first and the second ground conductor patterns are disposed at the outsides of the strip conductor pattern;

a first through-hole connection for an inner conductor, the first through-hole connection connected with and protruding through a hole in a tip portion of the strip conductor pattern, the first through hole connection penetrating the first dielectric substrate; and a plurality of second through-hole connections for an outer conductor, the plurality of second through-hole connections disposed around the first through-hole connection and connected to and connecting the first and the second ground conductor patterns;

wherein a serial high impedance portion is disposed near a connecting portion between the strip conductor pattern and the hole in the tip portion thereof, and wherein the through-hole for the inner conductor elongates to penetrate the second dielectric substrate.

* * * * *